(12) United States Patent
Senou et al.

(10) Patent No.: US 9,202,541 B2
(45) Date of Patent: Dec. 1, 2015

(54) SEMICONDUCTOR APPARATUS CONFIGURED TO REDUCE DATA PROCESSING PERFORMANCE

(75) Inventors: Shuuichi Senou, Kanagawa (JP);
Kenjyu Shimogawa, Kanagawa (JP);
Susumu Takano, Kanagawa (JP);
Toshihiko Funaki, Kanagawa (JP);
Hideaki Arima, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 449 days.

(21) Appl. No.: 13/607,306

(22) Filed: Sep. 7, 2012

(65) Prior Publication Data
US 2013/0058173 A1   Mar. 7, 2013

(30) Foreign Application Priority Data

Sep. 7, 2011   (JP) ................................. 2011-195158

(51) Int. Cl.
| | |
|---|---|
| G06F 13/36 | (2006.01) |
| G11C 7/22 | (2006.01) |
| G06F 13/40 | (2006.01) |
| G06F 3/06 | (2006.01) |

(52) U.S. Cl.
CPC ................ *G11C 7/22* (2013.01); *G06F 3/0635* (2013.01); *G06F 13/4022* (2013.01)

(58) Field of Classification Search
CPC .................................................. G06F 3/0635
USPC .......... 710/48–52, 104–110, 305–317, 36–38
See application file for complete search history.

(56) References Cited

U.S. PATENT DOCUMENTS

| | | | | |
|---|---|---|---|---|
| 6,266,710 | B1 * | 7/2001 | Dittmer et al. | 710/1 |
| 7,529,149 | B2 * | 5/2009 | Pyeon et al. | 365/230.03 |
| 7,979,629 | B2 * | 7/2011 | Lee et al. | 711/103 |
| 8,209,497 | B2 * | 6/2012 | Kajigaya | 711/149 |
| 8,793,460 | B2 * | 7/2014 | LaBerge et al. | 711/167 |
| 2006/0143366 | A1 * | 6/2006 | Yang et al. | 711/103 |
| 2007/0121389 | A1 * | 5/2007 | Wu et al. | 365/189.05 |
| 2009/0113118 | A1 * | 4/2009 | Lee et al. | 711/103 |
| 2009/0240897 | A1 | 9/2009 | Kajigaya | |
| 2013/0205100 | A1 * | 8/2013 | Sato et al. | 711/149 |

FOREIGN PATENT DOCUMENTS

| | | |
|---|---|---|
| JP | 57-208689 A | 12/1982 |
| JP | 2009-230792 A | 10/2009 |

* cited by examiner

*Primary Examiner* — Raymond Phan
(74) *Attorney, Agent, or Firm* — McDermott Will & Emery LLP

(57) ABSTRACT

A semiconductor apparatus according to an aspect of the present invention includes first and second bus-interface circuits, a mode information storage unit that stores first and second mode information, the first and second mode information being able to be set through the first bus-interface circuit, a first memory core that operates based on the first mode information, the first memory core being connected to the first bus-interface circuit and supplied with a first clock signal, a second memory core, the second memory core being supplied with a second clock signal and a select circuit that selectively connects the second memory core to the first or second bus-interface circuit based on predetermined switching information, in which the second memory core operates based on the second mode information when the second memory core is connected to the second bus-interface circuit.

18 Claims, 15 Drawing Sheets

| Command | CSN_1 | WEN_1 | REFN_1 | An-1_A~A0_1 | Comment |
|---|---|---|---|---|---|
| NOP | 1 | x | x | x | No Operation |
| READ | 0 | 1 | 1 | Address | Read |
| WRITE | 0 | 0 | 1 | Address | Write |
| REFRESH | 0 | 1 | 0 | x | - |
| MRS | 0 | 0 | 0 | CODE | Mode setting |

SEMICONDUCTOR APPARATUS CONFIGURED TO REDUCE DATA PROCESSING PERFORMANCE

CROSS-REFERENCE TO RELATED APPLICATIONS

This application is based upon and claims the benefit of priority from Japanese patent application No. 2011-195158, filed on Sep. 7, 2011, the disclosure of which is incorporated herein in its entirety by reference.

BACKGROUND

The present invention relates to a semiconductor apparatus, in particular a semiconductor apparatus suitable for preventing the deterioration of the data processing performance.

As the semiconductor manufacturing process has been miniaturized, the scale of a circuit that can be mounted on one semiconductor chip is increasing. As a result, in logic LSIs, large number of functional blocks necessary for the system can be mounted on one semiconductor chip. Therefore, a larger number of data processes are carried out in a logic LSI. Because of this trend, it has been required to improve data transfer performance between a logic LSI and a memory and thereby improve the overall performance of the system.

Japanese Unexamined Patent Application Publication No. 2009-230792 discloses a solution for this requirement. A multi-port memory disclosed in Japanese Unexamined Patent Application Publication No. 2009-230792 includes a memory array that includes a plurality of memory cells disposed at intersections of a plurality of bit lines and a plurality of word lines and is divided into n memory banks (n is an integer equal to or greater than 2), m input/output ports (m is an integer equal to or greater than 2) that independently inputs/outputs a command, an address, and data from/to each of the memory banks, and a path switching circuit that arbitrarily sets a command signal path, an address signal path, and a data signal path between the memory banks and the input/output ports. The path switching circuit includes crossbar switches that set the connection state of each of the command signal line, the address signal line, and the data signal line between the memory banks and the input/output ports, and a broadcast switch unit that, in a broadcast mode, forms a path through which data read from one memory bank is output to a plurality of ports or data input from one port is written into a plurality of memory banks.

This multi-port memory further includes an arbitration circuit that, when access requests from two or more input/output ports to the same memory bank occur simultaneously in the normal operation state, accepts an access request from an input/output having a higher priority and prohibits the access request(s) from the remaining input/output port(s). In the broadcast mode, this arbitration circuit also prohibits, for example, accesses from input/output ports other than the input/output port from which the broadcast read command is input.

Further, Japanese Unexamined Patent Application Publication No. 57-208689 discloses a technique for independently driving a plurality of elements having a memory function by supplying independent clock signals to the plurality of elements having a memory function.

SUMMARY

The present inventors have found the following problem. In the multi-port memory disclosed in Japanese Unexamined Patent Application Publication No. 2009-230792, it is presumed that when access requests from two or more input/output ports to the same memory bank occur at the same time, the accesses are accepted one after another in the descending order of the priorities of the input/output ports. Therefore, an access from an input/output port having a low priority to the memory bank is delayed. As a result, there has been a problem in this multi-port memory that the data processing performance deteriorates.

Further, Japanese Unexamined Patent Application Publication No. 2009-230792 does not disclose any configuration in which the operating mode of a plurality of memory banks can be arbitrarily changed. Therefore, it seems that the operating mode of the plurality of memory banks is unchangeable. Therefore, in the multi-port memory disclosed in Japanese Unexamined Patent Application Publication No. 2009-230792, it is impossible to individually set the access mode such as a burst length and/or operation parameters such as a clock frequency for each memory bank and therefore it is very difficult to optimize the data processing performance.

A first aspect of the present invention is a semiconductor apparatus including: a plurality of memory cores to which a clock signal can be individually supplied; a mode information storage unit that stores operation information for each of the plurality of memory cores; and a select circuit that selectively connects each of the plurality of memory cores to one bus-interface circuit.

With the above-described circuit configuration, it is possible to optimize the data processing performance.

According to an aspect of the present invention, it is possible to provide a semiconductor apparatus capable of preventing the deterioration of the data processing performance.

BRIEF DESCRIPTION OF THE DRAWINGS

The above and other aspects, advantages and features will be more apparent from the following description of certain embodiments taken in conjunction with the accompanying drawings, in which:

FIG. 3 shows relations between command signals and address signals supplied to a memory according to a first embodiment of the present invention;

DETAILED DESCRIPTION

Firstly, before explaining embodiments according to the present invention, a configuration that has been examined by the inventors of the present application prior to accomplishing the present invention is explained hereinafter.

Figure 10:
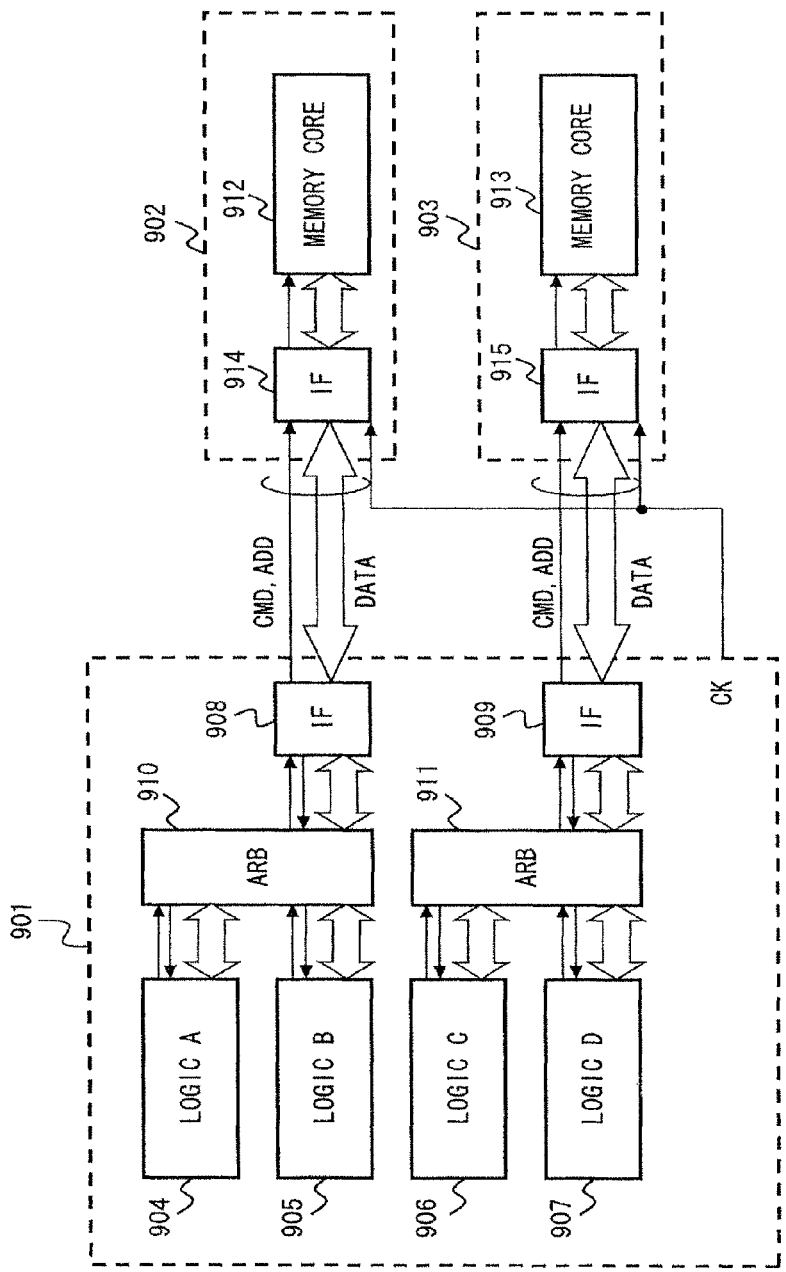
FIG. 10 is a block diagram showing a semiconductor integrated circuit according to an idea conceived before the present invention is accomplished.

FIG. 10 is a block diagram showing a semiconductor integrated circuit according to an idea conceived before the present invention is accomplished. A semiconductor integrated circuit shown in FIG. 10 includes an integrated circuit 901 including a plurality of functional blocks, and memories (semiconductor apparatuses) 902 and 903. Each of the memories 902 and 903 adopts a shared-memory scheme in which accesses from a plurality of functional blocks are made possible by using a set of channels consisting of a data signal (DATA), a command signal (CMD) used to control the reading/writing of data, and an address signal (ADD) specifying a storage area from/to which data is read/written.

Note that the integrated circuit 901 is, for example, an FPGA (Field Programmable Gate Array) whose configuration can be changed by software. In the field of embedded devices such as digital appliances and network devices, it is possible to provide a plurality of derived products by using common FPGA substrates (platforms), In the following explanation, an example in which the integrated circuit 901 is an FPGA (hereinafter called "PFGA 901") is explained.

By programming the FPGA 901, the FPGA 901 includes four independent functional blocks 904 to 907, interface circuits 908 and 909, and arbitration circuits 910 and 911.

The functional blocks 904 and 905 share the memory 902 for the temporary saving of working data and the like, and the functional blocks 906 and 907 share the memory 903 for the temporary saving of working data and the like.

The arbitration circuit 910 has a function of determining the order of accesses when the functional blocks 904 and 905 attempt to access the memory 902 at the same time. Similarly, the arbitration circuit 911 has a function of determining the order of accesses when the functional blocks 905 and 906 attempt to access the memory 903 at the same time. The interface circuit 908 is a circuit that interfaces an access from the functional block 904 or 905 to the memory 902. The interface circuit 909 is a circuit that interfaces an access from the functional block 906 or 907 to the memory 903.

The memory 902 includes a memory core 912 and an interface circuit 914. Note that the memory core 912 is equipped with an access control unit (not shown) that performs access from the FPGA 901 to the memory core 912. The memory 903 includes a memory core 913 and an interface circuit 915. Note that the memory core 913 is equipped with an access control unit (not shown) that performs access from the FPGA 901 to the memory core 913. Each of the memory cores 912 and 913 includes a plurality of memory cells (storage area) for storing data. In each of the memory cores 912 and 913, data is written into a memory cell specified by an address signal, or data stored in a memory cell specified by an address signal is read out. The interface circuit 914 is a circuit that interfaces an access from the FPGA 901 to the memory core 912. The interface circuit 915 is a circuit that interfaces an access from the FPGA 901 to the memory core 913.

That is, the signal transmission between the functional blocks 904 and 905 and the memory core 912 is performed through the interface circuit 908 on the FPGA 901 side and the interface circuit 914 on the memory 902 side. The signal transmission between the functional blocks 906 and 907 and the memory core 913 is performed through the interface circuit 909 on the FPGA 901 side and the interface circuit 915 on the memory 902 side.

Figure 11A:
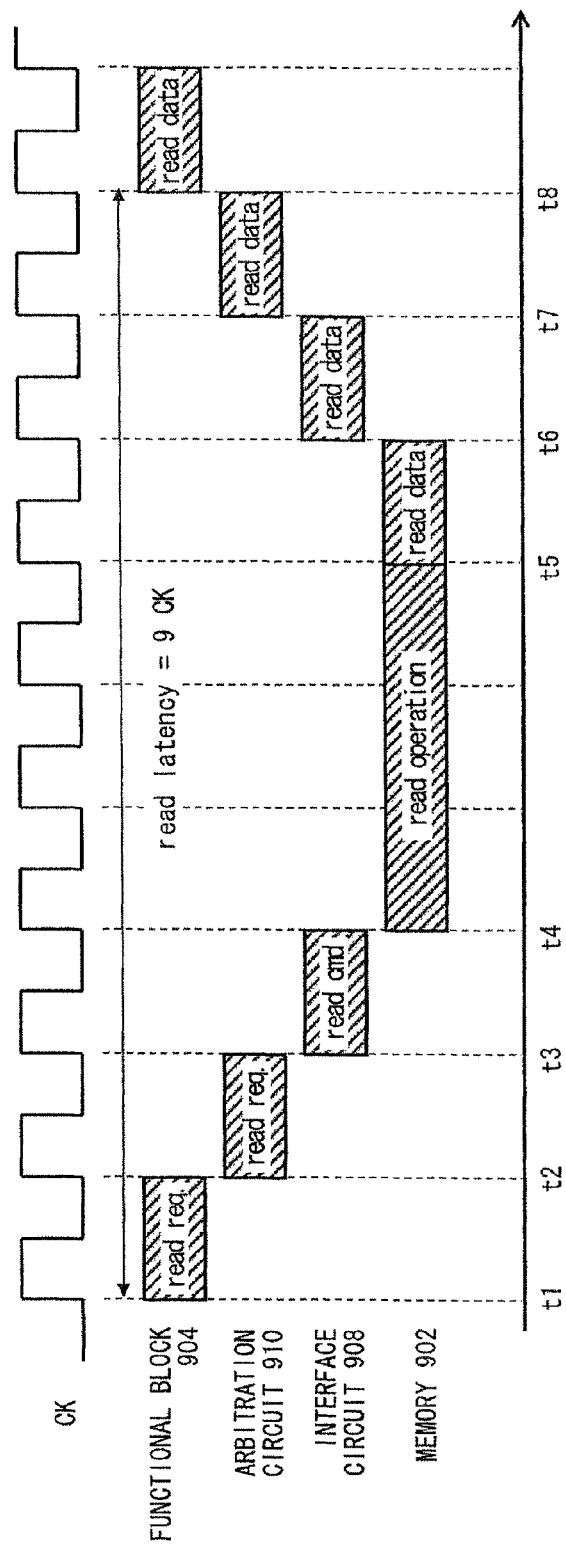
FIG. 11A is a timing chart showing an operation of a semiconductor integrated circuit according to an idea conceived before the present invention is accomplished.
Figure 11B:
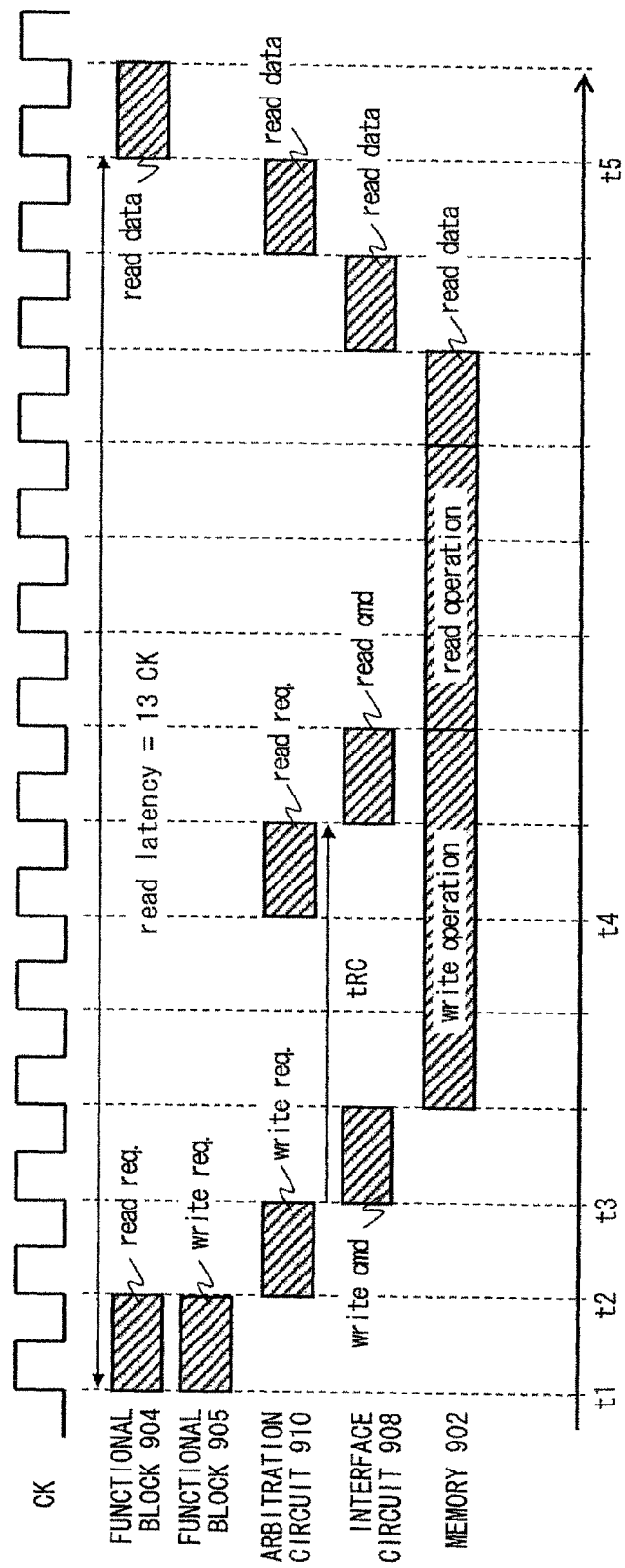
FIG. 11B is a timing chart showing an operation of a semiconductor integrated circuit according to an idea conceived before the present invention is accomplished.
Figure 11C:
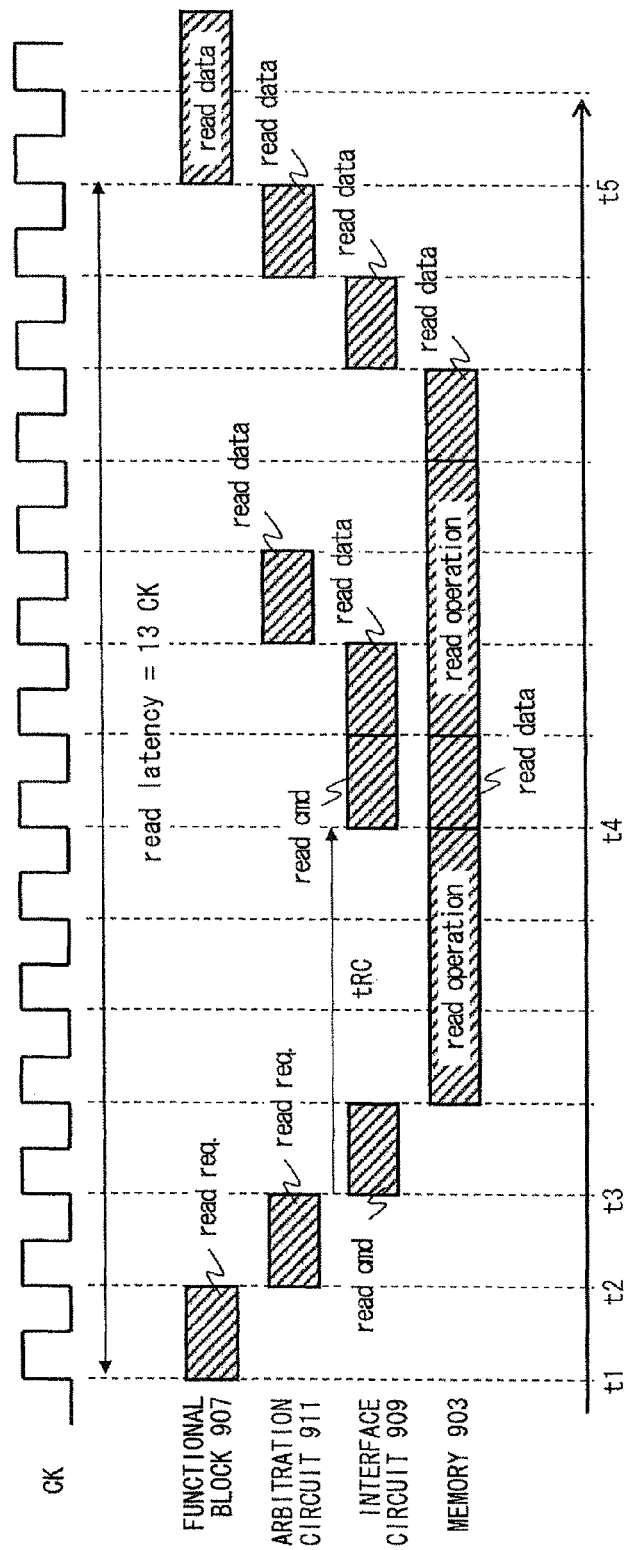
FIG. 11C is a timing chart showing an operation of a semiconductor integrated circuit according to an idea conceived before the present invention is accomplished.

FIGS. 11A to 11C are timing charts showing operations of the semiconductor integrated circuit shown in FIG. 10. More specifically, FIG. 11A is a timing chart in a case where only the functional block 904 among the functional blocks 904 and 905 requests data reading from the memory 902. FIG. 11B is a timing chart in a case where the functional block 904 requests data reading from the memory 902 and the functional block 905 requests data writing to the memory 902 at the same time. FIG. 11C is a timing chart in a case where only the functional block 907 among the functional blocks 906 and 907 requests data reading from the memory 903.

It is assumed that the amount of read data that the functional block 904, 905 or 906 needs to receive from the memory 902 or 903 by one data read request is a data amount X. Meanwhile, it is assumed that the amount of read data that the functional block 907 needs to receive from the memory 903 by one data read request is twice the data mount X (i.e., data amount 2X). That is, the functional block 907 needs to receive read data that is twice as large as the read data of the functional block 904 by one data read request. Further, each of the memories 902 and 903 can transmit read data having a data amount X in response to one data read request.

Firstly, the operation where only the functional block 904 among the functional blocks 904 and 905 requests data reading from the memory 902 is explained with reference to FIG. 11A. Firstly, the functional block 904 issues a read request to the arbitration circuit 910 (time t1). Since no request is issued from the other functional block, the arbitration circuit 910 accepts the read request received from the functional block 904 immediately and transfers the received read request to the interface circuit 908 (time t2). The interface circuit 908 generates a command signal and an address signal according to the read request received from the arbitration circuit 910 and outputs the generated signals to the memory 902 (time t3).

In the memory 902, the interface circuit 914 receives the command signal and the address signal output from the FPGA 901 and transfers the received signals to the memory core 912 located behind the interface circuit 914 (time t4). In the memory core 912, after the reading operation that takes a predetermined period, data stored in the memory cell specified by the address signal is read out (time t5). The interface circuit 914 outputs the data read from the memory core 912 to the FPGA 901 (time t5).

In the FPGA 901, the interface circuit 908 receives the data output from the memory 902 and transfers the received data to the arbitration circuit 910 (time t6). The arbitration circuit 910 transfers the data to the functional block 904, which has issued the read request (time t7). The functional block 904 takes in the data transferred from the arbitration circuit 910 in synchronization with a clock signal CK (time t8). In this manner, a series of operations for a data read request has been completed. In the example shown in FIG. 11A, the time period from when the functional block 904 issues the data read request to when the functional block 904 receives the data is nine clock cycles (time t1 to t8).

Next, an operation in which the functional block 904 requests data reading from the memory 902 and the functional block 905 requests data writing to the memory 902 at the same time is explained with reference to FIG. 11B. Firstly, the functional block 904 issues a read request to the arbitration circuit 910 and the functional block 905 issues a write request to the arbitration circuit 910 at the same time (time t1).

The arbitration circuit 910 gives a higher priority, for example, to the write request issued from the functional block 905 and thereby transfers the write request to the interface circuit 908 (time t2). Note that the read request issued from the functional block 904 is put on hold while the writing operation is being performed according to the write request issued from the functional block 905. The interface circuit 908 generates a command signal, an address signal, and a write data signal according to the write request received from the arbitration circuit 910 and outputs the generated signals to the memory 902 (time t3).

Note that in the memory 902, the minimum, value for the time interval (random cycle) tRC at which data read requests and data write requests are accepted is specified in advance according to the operating speed of the memory core 912. Therefore, the arbitration circuit 910 puts the read request issued from the functional block 904 on hold so that the interval of accesses from the FPGA 901 to the memory 902 becomes equal to or greater than this minimum value for the time interval tRC (time t2 to t4). At the time t4, the arbitration circuit 910 transfers the read request issued from the functional block 904, which has been put on hold, to the interface circuit 908. The subsequent operations are similar to those shown in FIG. 11A, and therefore their explanation is omitted here.

In the example shown in FIG. 11B, the time period from when the functional block 904 issues the data read request to when the functional block 904 receives the data is 13 clock cycles (time t1 to t5), which is longer than that of the example shown in FIG. 11A by four cycles. That is, when two or more functional blocks attempt to access the same memory at the same time, the data processing performance is lowered by an amount equivalent to the increase in the number of required clock cycles.

As described above, the shared-memory scheme is effective in that one memory can be shared by a plurality of functional blocks and therefore, for example, the redesign of the platform can be avoided even when the number of functional blocks within an FPGA is changed. However, there is a problem that when two or more functional blocks attempt to access the same memory at the same time, the data processing performance deteriorates.

Next, an operation where only the functional block 907 among the functional blocks 906 and 907 requests data reading from the memory 903 is explained with reference to FIG. 11C. Firstly, the functional block 907 issues a read request to the arbitration circuit 911 (time t1). Since no request is issued from the other functional block, the arbitration circuit 911 immediately accepts the read request received from the functional block 907. Note that, as described previously, the functional block 907 needs to receive read data having a data amount 2X by one data read request. In contrast to this, the memory 903 can transmit read data having a data amount X in response to one data read request. That is, the memory 903 cannot transmit all the read data that is requested by the data read request issued from the functional block 907 at once.

Therefore, the arbitration circuit 911 determines that it is necessary to divide the one data read request issued from the functional block 907 into two data read requests (hereinafter referred to as "first half of the data read request" and "second half of the data read request"). Then, the arbitration circuit 911 transfers the first half of the data read request to the interface circuit 909 and performs scheduling for the second half of the data read request (time t2). The interface circuit 909 generates a command signal and an address signal according to the read request received from the arbitration circuit 911 and outputs the generated signals to the memory 903 (time t3).

Note that in the memory 903, the minimum value for the time interval (random cycle) tRC at which a data read request or a data write request is accepted is defined in advance according to the operating speed of the memory core 913. Therefore, the arbitration circuit 911 puts the second half of the data read request on hold so that the interval between accesses from the FPGA 901 to the memory 903 becomes equal to or greater than this minimum value for the time interval tRC (time t2 to t4). At the time t4, the arbitration circuit 911 transfers the second half of the data read request, which has been put on hold, to the interface circuit 909. The subsequent operations are similar to those shown in FIG. 11A, and therefore their explanation is omitted here.

In the example shown in FIG. 11C, the time period from when the functional block 905 issues the data read request to when the functional block 905 receives the data is 13 clock cycles (time t1 to t5), which is longer than that of the example shown in FIG. 11A by four cycles. That is, the data processing performance is lowered by an amount equivalent to the increase in the number of required clock cycles.

As described above, when one memory is shared by a plurality of functional blocks having different access modes such as burst lengths, there is a problem that the data processing performance deteriorates.

In summary, in the shared-memory scheme, there is a problem that when a plurality of functional blocks attempt to access the same memory at the same time, the data processing performance deteriorates. Further, when one memory is shared by a plurality of functional blocks having different access modes such as burst lengths, there is another problem that the data processing performance deteriorates even further. In particular, when the number of functional blocks provided in an FPGA becomes larger, arbitration operations occur frequently and thus the deterioration of the data processing performance becomes more aggravated. On the other hand, when the number of functional blocks that share one memory is reduced in order to put more importance on the performance, the number of necessary memory cores needs to be changed depending on the number of functional blocks, and thereby making the change of the platform unavoidable. In addition, it causes another problem in terms of the cost because the increased memory capacity cannot be fully used. For the above-described problems, it has been desired to develop a memory (semiconductor apparatus) capable of preventing the deterioration of the data processing performance.

Embodiments according to the present invention are explained hereinafter with reference to the drawings. It should be noted that the drawings are made in a simple manner, and therefore the technical scope of the present invention should not be narrowly interpreted based on these drawings. Further, the same components are assigned with the same symbols and their duplicated explanation is omitted.

First Embodiment

Figure 1:
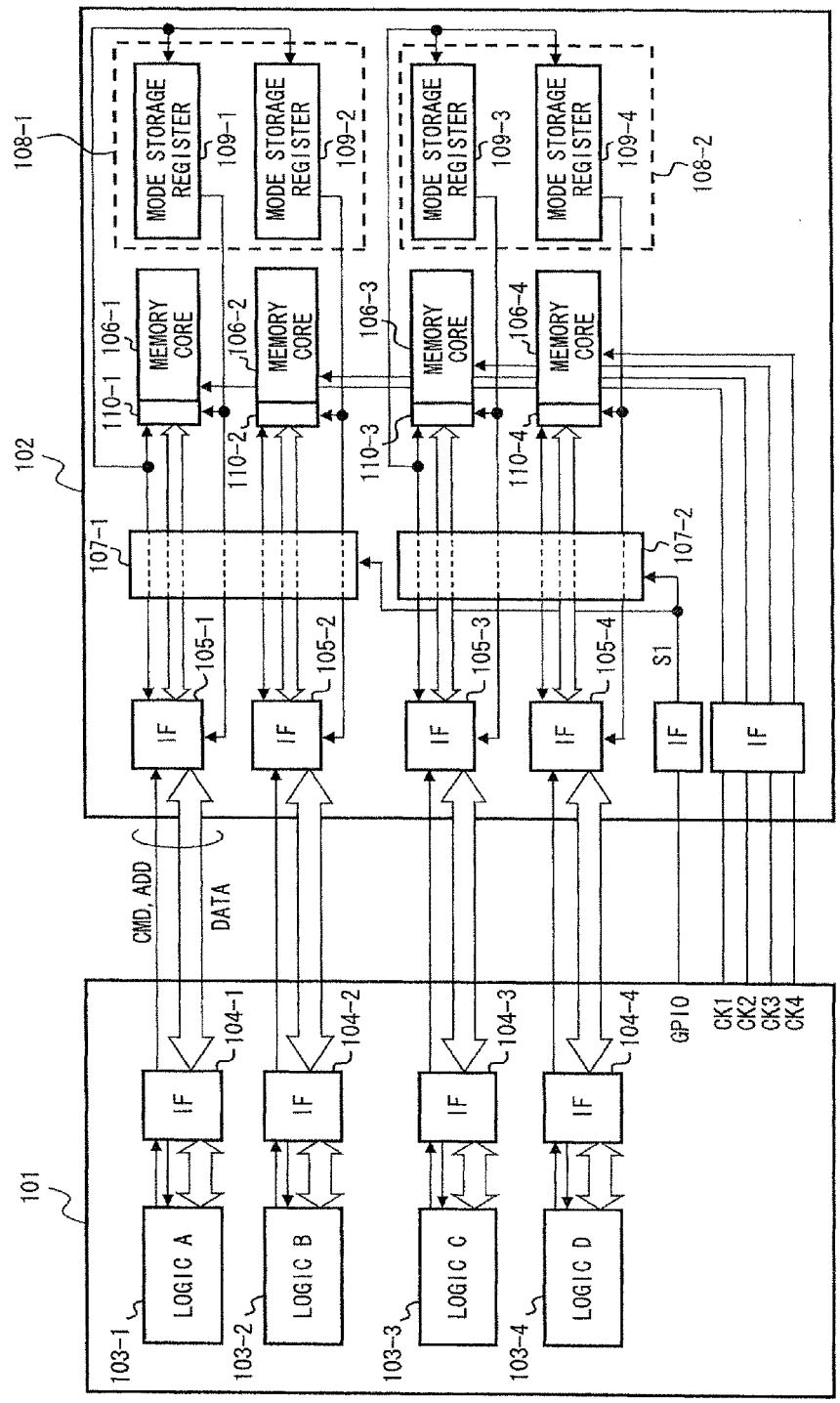
FIG. 1 is a block diagram showing a semiconductor integrated circuit according to a first embodiment of the present invention.

FIG. 1 is a block diagram showing a semiconductor integrated circuit including a memory (semiconductor apparatus) according to a first embodiment of the present invention. A memory according to this embodiment includes a plurality of independently-accessible memory cores, a plurality of interface circuits that interface access from an external circuit to at least one of the plurality of memory cores, a select circuit that selects a signal path(s) in such a manner that each of the plurality of memory cores is connected to one of the plurality of interface circuits, and a control unit that switches respective operating modes of the plurality of memory cores according to respective access modes from the external circuit to the plurality of memory cores. As a result, in the memory according to this embodiment, the situation in which two or more functional blocks simultaneously issue read/write requests to the same memory core never occurs. Therefore, there is no need to perform arbitration by using an arbitration circuit, and thus making it possible to prevent the deterioration of the data processing performance. Further, since the memory according to this embodiment can switch respective operating modes of the plurality of memory cores according to respective access modes from the external circuit to the plurality of memory cores, it is possible to prevent the deterioration of the data processing performance even when the memory is accessed from a plurality of functional blocks having different access modes such as burst lengths. The memory according to this embodiment is explained hereinafter in a more detailed manner.

A semiconductor integrated circuit shown in FIG. 1 includes an integrated circuit (external circuit) 101 including a plurality of functional blocks, and a memory 102. Note that the integrated circuit 101 is, for example, an FPGA (Field Programmable Gate Array) whose configuration can be changed by software. In the following explanation, an example in which the integrated circuit 101 is an FPGA (hereinafter called "PFGA 101") is explained.

By programming the FPGA 101, the FPGA 101 includes four independent functional blocks 103-1 to 103-4 and interface circuits 104-1 and 104-4. Each of the interface circuits 104-1 and 104-4 is a circuit that interfaces an access from a respective one of the functional blocks 103-1 to 103-4 to the memory 102. Although not shown in the figure, that the FPGA 101 further includes a circuit that generates clock signals supplied to the functional blocks 103-1 to 103-4 and the memory 102, and a circuit that generates a switching signal (switching information) S1.

The memory 102 includes four independently-accessible memory cores, i.e., a memory core (first memory core) 106-1, a memory core (second memory core) 106-2, a memory core 106-3, and a memory core 106-4. Further, the memory 102 also includes four interface circuits, i.e., an interface circuit (first bus-interface circuit) 105-1, an interface circuit (second bus-interface circuit) 105-2, an interface circuit 105-3, and an interface circuit 105-4. Further, the memory 102 also includes select circuits 107-1 and 107-2, mode information storage unit 108-1 and 108-2, and access control units 110-1 to 110-4. Note that the memory cores 106-1 and 106-2 form a memory array M1. The memory cores 106-3 and 106-4 form a memory array M2. Further, the access control units 110-1 to 110-4 form a control unit. The signal transmission between the FPGA 101 and the memory 102 is performed through an external bus.

Each of the memory cores 106-1 to 106-4 includes a plurality of memory cells (storage area) for storing data. The access control units 110-1 to 110-4 switch the operating modes of the respective memory cores 106-1 to 106-4 based on the mode information stored in respective mode setting registers (mode storage registers) 109-1 to 109-4 (which are explained later). The memory cores 106-1 to 106-4 operate based on the operating modes set in the respective access control units 110-1 to 110-4. In this way, the FPGA 101 can access the memory cores 106-1 to 106-4 in a desired access mode(s). More specifically, the FPGA 101 can access the memory cores 106-1 to 106-4 in an access mode(s) that is specified by the mode information stored in the mode setting registers 109-1 to 109-4.

In the memory cores 106-1 to 106-4, data is written into a memory cell(s) specified by an address signal (ADD), or data stored in a memory cell(s) specified by an address signal is read out. Note that the switching between the data reading operation and the data writing operation is performed according to a write enable signal included in the command signal (CMD).

The interface circuits 105-1 to 105-4 are circuits that interface accesses from the FPGA 101 to at least one of the memory cores 106-1 to 106-4. Note that whether each of the interface circuits 105-1 to 105-4 is activated or not (used or not) is controlled based on a switching signal (switching information) S1 supplied from the FPGA 101.

The select circuit 107-1 is disposed between the interface circuits 105-1 and 105-2 and the memory cores 106-1 and 106-2. The select circuit 107-1 selects a signal path(s) between the interface circuits 105-1 and 105-2 and the memory cores 106-1 and 106-2 according to the switching signal S1 supplied from the FPGA 101. More specifically, the select circuit 107-1 selects a signal path(s) in such a manner that each of the plurality of memory cores 106-1 and 106-2 is connected to one of the plurality of interface circuits 105-1 and 105-2. In other words, the select circuit 107-1 selects a signal path(s) between the activated interface circuit(s) and the memory cores 106-1 and 106-2 in such a manner that the activated interface circuits are connected to different memory cores. Note that the "activated interface circuit" is a circuit that is actually interfacing access from the FPGA 101 to the memory array M1 (memory core 106-1, 106-2) among the interface circuits 105-1 and 105-2.

The select circuit 107-2 is disposed between the interface circuits 105-3 and 105-4 and the memory cores 106-3 and 106-4. The select circuit 107-2 selects a signal path(s) between the interface circuits 105-3 and 105-4 and the memory cores 106-3 and 106-4 according to the switching signal S1 supplied from the FPGA 101. More specifically, the select circuit 107-2 selects a signal path(s) in such a manner that each of the plurality of memory cores 106-3 and 106-4 is connected to one of the plurality of interface circuits 105-3 and 105-4. In other words, the select circuit 107-2 selects a signal path(s) between the activated interface circuit(s) and the memory cores 106-3 and 106-4 in such a manner the activated interface circuits are connected to different memory cores. Note that the "activated interface circuit" is a circuit that is actually interfacing access from the FPGA 101 to the memory array M2 (memory core 106-3, 106-4) among the interface circuits 105-3 and 105-4.

In the example shown in FIG. 1, an H-level switching signal S1 is supplied from the FPGA 101 to the memory 102. As a result, in the memory 102, the interface circuits 105-1 to 105-4 are connected to the memory cores 106-1 to 106-4 respectively through the select circuits 107-1 and 107-2. That is, all of the interface circuits 105-1 to 105-4 are activated.

More specifically, in the example shown in FIG. 1, the signal transmission between the functional block 103-1 and the memory core 106-1 is performed through the interface circuit 104-1 of the FPGA 101 side and the interface circuit 105-1 of the memory 102 side. The signal transmission between the functional block 103-2 and the memory core 106-2 is performed through the interface circuit 104-2 of the FPGA 101 side and the interface circuit 105-2 of the memory 102 side. The signal transmission between the functional block 103-3 and the memory core 106-3 is performed through the interface circuit 104-3 of the FPGA 101 side and the interface circuit 105-3 of the memory 102 side. The signal transmission between the functional block 103-4 and the memory core 106-4 is performed through the interface circuit 104-4 of the FPGA 101 side and the interface circuit 105-4 of the memory 102 side.

In this manner, each of the plurality of memory cores 106-1 to 106-4 is connected to one of the plurality of interface circuits 105-1 to 105-4. In other words, the activated interface circuits 105-1 to 105-4 are connected to different memory cores.

Note that the other signal path configurations may be also adopted, provided that the activated interface circuits are connected to different memory cores. For example, the signal paths may be selected in such a manner that the interface circuit 105-1 is connected to the memory core 106-2 and the interface circuit 105-2 is connected to the memory core 106-1.

The mode information storage unit 108-1 is a unit that individually stores mode information for each channel. The mode information storage unit 108-1 includes mode setting registers 109-1 and 109-2 corresponding to the memory cores 106-1 and 106-2 respectively. The mode setting registers 109-1 and 109-2 store mode information for the memory cores 106-1 and 106-2 respectively (first and second mode information). Note that the mode information is information that specifies the access mode (e.g., burst length) from the FPGA 101 to the memory core. In this embodiment, the mode information stored in each of the mode setting registers 109-1 and 109-2 is transmitted from the FPGA 101 through the address signal line and the command signal line and supplied through the interface circuit 105-1 when the operating mode is set.

The access control unit 110-1 switches the operating mode of the memory core 106-1 based on the mode information stored in the mode setting register 109-1. The memory core 106-1 operates in the operating mode set by the access control unit 110-1. As a result, the FPGA 101 (functional block 103-1 in this example) can access the memory core 106-1 in a desired access mode. More specifically, the FPGA 101 can access the memory core 106-1 in an access mode specified by the mode information stored in the mode setting register 109-1.

Similarly, the access control unit 110-2 switches the operating mode of the memory core 106-2 based on the mode information stored in the mode setting register 109-2. The memory core 106-2 operates in the operating mode set by the access control unit 110-2. As a result, the FPGA 101 (functional block 103-2 in this example) can access the memory core 106-2 in a desired access mode. More specifically, the FPGA 101 (functional block 103-2 in this example) can access the memory core 106-2 in an access mode specified by the mode information stored in the mode setting register 109-2. Details of the operating mode setting operation are explained later.

The mode information storage unit 108-2 is a unit that individually stores mode information for each channel. The mode information storage unit 108-2 includes mode setting registers 109-3 and 109-4 corresponding to the memory cores 106-3 and 106-4 respectively. The mode setting registers 109-3 and 109-4 stores mode information for the memory cores 106-3 and 106-4 respectively. In this embodiment, the mode information stored in each of the mode setting registers 109-3 and 109-4 is transmitted from the FPGA 101 through the address signal line and the command signal line and supplied through the interface circuit 105-3 when the operating mode is set.

The access control unit 110-3 switches the operating mode of the memory core 106-3 based on the mode information stored in the mode setting register 109-3. The memory core 106-3 operates in the operating mode set by the access control unit 110-3. As a result, the FPGA 101 (functional block 103-3 in this example) can access the memory core 106-3 in a desired access mode. More specifically, the FPGA 101 (functional block 103-3 in this example) can access the memory core 106-3 in an access mode specified by the mode information stored in the mode setting register 109-3.

Similarly, the access control unit 110-4 switches the operating mode of the memory core 106-4 based on the mode information stored in the mode setting register 109-4. The memory core 106-4 operates in the operating mode set by the access control unit 110-4. As a result, the FPGA 101 (functional block 103-4 in this example) can access the memory core 106-4 in a desired access mode. More specifically, the FPGA 101 (functional block 103-4 in this example) can access the memory core 106-4 in an access mode specified by the mode information stored in the mode setting register 109-4.

The FPGA 101 generates a switching signal S1 having a signal level that is determined according to the number of functional blocks that need to access the memory 102, and outputs the generated switching signal S1 from an external terminal GPIO to the memory 102. Further, the FPGA 101 generates clock signals CK1 to CK4 and outputs the generated clock signals to the memory 102. The clock signals CK1 to CK4 are supplied to the access control units 110-1 to 110-4 respectively. The access control units 110-1 to 110-4 performs access from the FPGA 101 to the memory cores 106-1 to 106-4 in synchronization with the clock signals CK1 to CK4 respectively. That is, in the memory 102, it is possible to operate the memory cores 106-1 to 106-4 in different operating frequencies. In other words, the memory 102 can be operated in a different operating frequency for each channel. Note that the clock signal CK1 may be also referred to as "first clock signal". The clock signal CK2 may be also referred to as "second clock signal".

Figure 2:
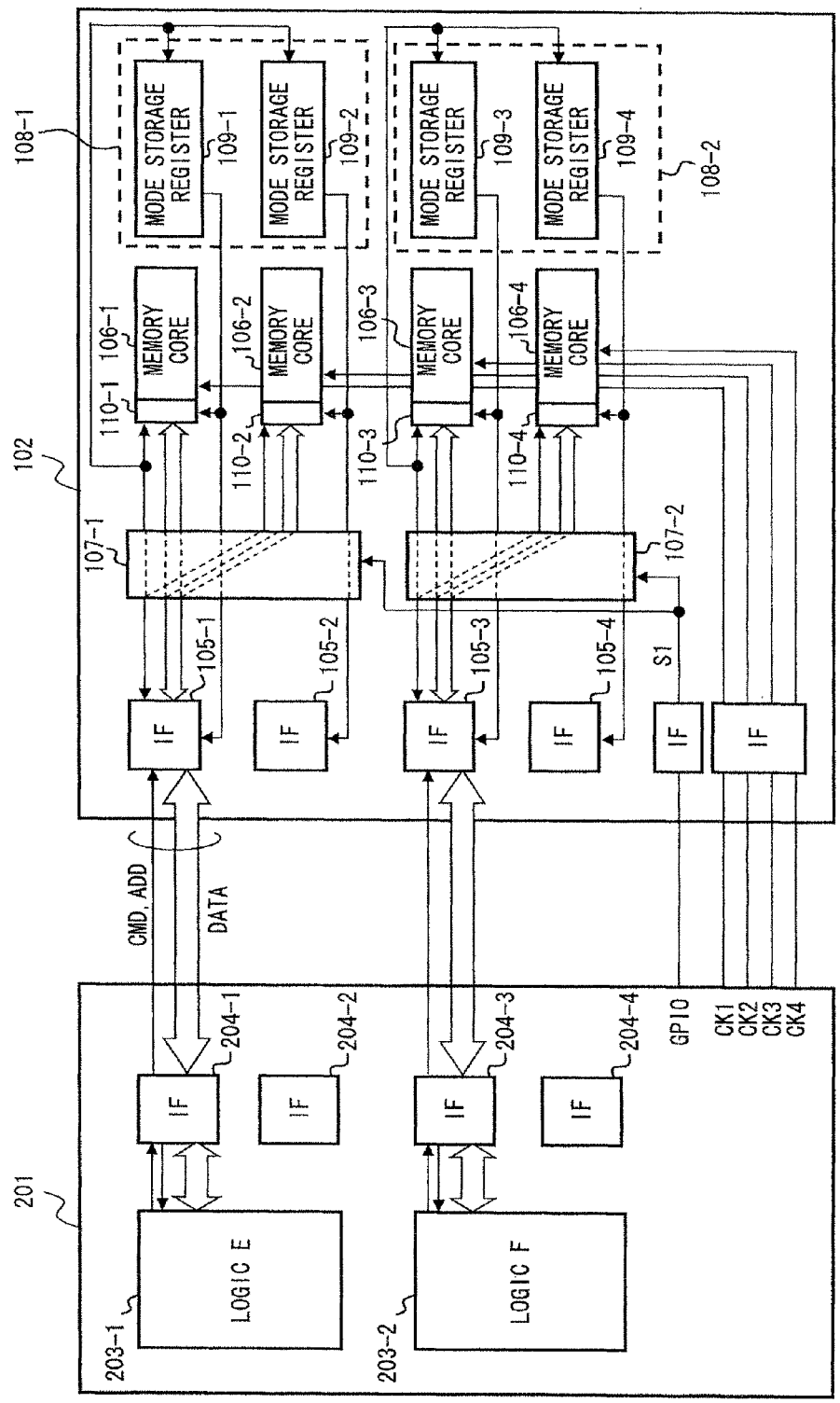
FIG. 2 is a block diagram showing a semiconductor integrated circuit according to a first embodiment of the present invention.

A semiconductor integrated circuit shown in FIG. 2A is obtained by reprogramming the FPGA 101 shown in FIG. 1, and the semiconductor integrated circuit shown in FIG. 2 is hereinafter called "FPGA 201". Specifically, the FPGA 201 is reprogrammed so that it has two independent functional blocks 203-1 and 203-2 and interface circuits 204-1 to 204-4. The remaining circuit configuration is similar to that shown in FIG. 1, and therefore its explanation is omitted here.

The interface circuits 204-1 and 204-3 are circuits that interface accesses from the functional blocks 203-1 and 203-2, respectively, to the memory 102. Meanwhile, the interface circuits 204-2 and 204-4 are not used for the interface with the memory 102.

In the example shown in FIG. 2, an L-level switching signal S1 is supplied from the FPGA 201 to the memory 102. As a result, in the memory 102, the interface circuit 105-1 is connected to the memory cores 106-1 and 106-2 through the select circuit 107-1, and the interface circuit 105-3 is connected to the memory cores 106-3 and 106-4 through the select circuit 107-2. That is, among the interface circuits 105-1 to 105-4, only the interface circuits 105-1 and 105-3 are activated (actually used).

That is, in the example shown in FIG. 2, the signal transmission between the functional block 203-1 and the memory cores 106-1 and 106-2 is performed through the interface circuit 204-1 of the FPGA 201 side and the interface circuit 105-1 of the memory 102 side. The signal transmission between the functional block 203-2 and the memory cores 106-3 and 106-4 is performed through the interface circuit 204-3 of the FPGA 201 side and the interface circuit 105-3 of the memory 102 side.

In this manner, each of the plurality of memory cores 106-1 to 106-4 is connected to one of the plurality of interface circuits 105-1 to 105-4. In other words, the activated interface circuits 105-1 and 105-3 are connected to different memory cores.

Meanwhile, the interface circuits 105-2 and 105-4 are not used. Therefore, instead of the signal supplied from the FPGA 201, a fixed signal (predetermined logic level voltage), for example, is supplied to the interface circuits 105-2 and 105-4. As a result, it is possible to prevent the input terminal(s) from becoming an opened state and thereby prevent the floating state.

Note that the other signal path configurations may be also adopted, provided that the activated interface circuits are connected to different memory cores. For example, the signal paths may be selected in such a manner that the interface circuit 105-1 is connected only to the memory core 106-1 and the interface circuit 105-3 is connected only to the memory core 106-3.

As described above, in the memory 102 according to this embodiment of the present invention, the select circuits 107-1 and 107-2 select signal paths between the activated (actually-used) interface circuits and the memory array(s) in such a manner that the interface circuits are connected to different memory cores. In other words, the select circuits 107-1 and 107-2 select signal paths in such a manner that each of the plurality of memory cores is connected to one of the plurality of interface circuits. As a result, in the memory 102 according to this embodiment, the situation in which two or more functional blocks simultaneously issue read/write requests to the same memory core never occurs. Therefore, there is no need to perform arbitration by using an arbitration circuit, and thus making it possible to prevent the deterioration of the data processing performance. Note that although the number of the activated interface circuits is four or two in the memory 102 in the above-described examples, the present invention is not limited to those configurations. The number of activated interface circuits can be arbitrarily changed.

Figure 4:
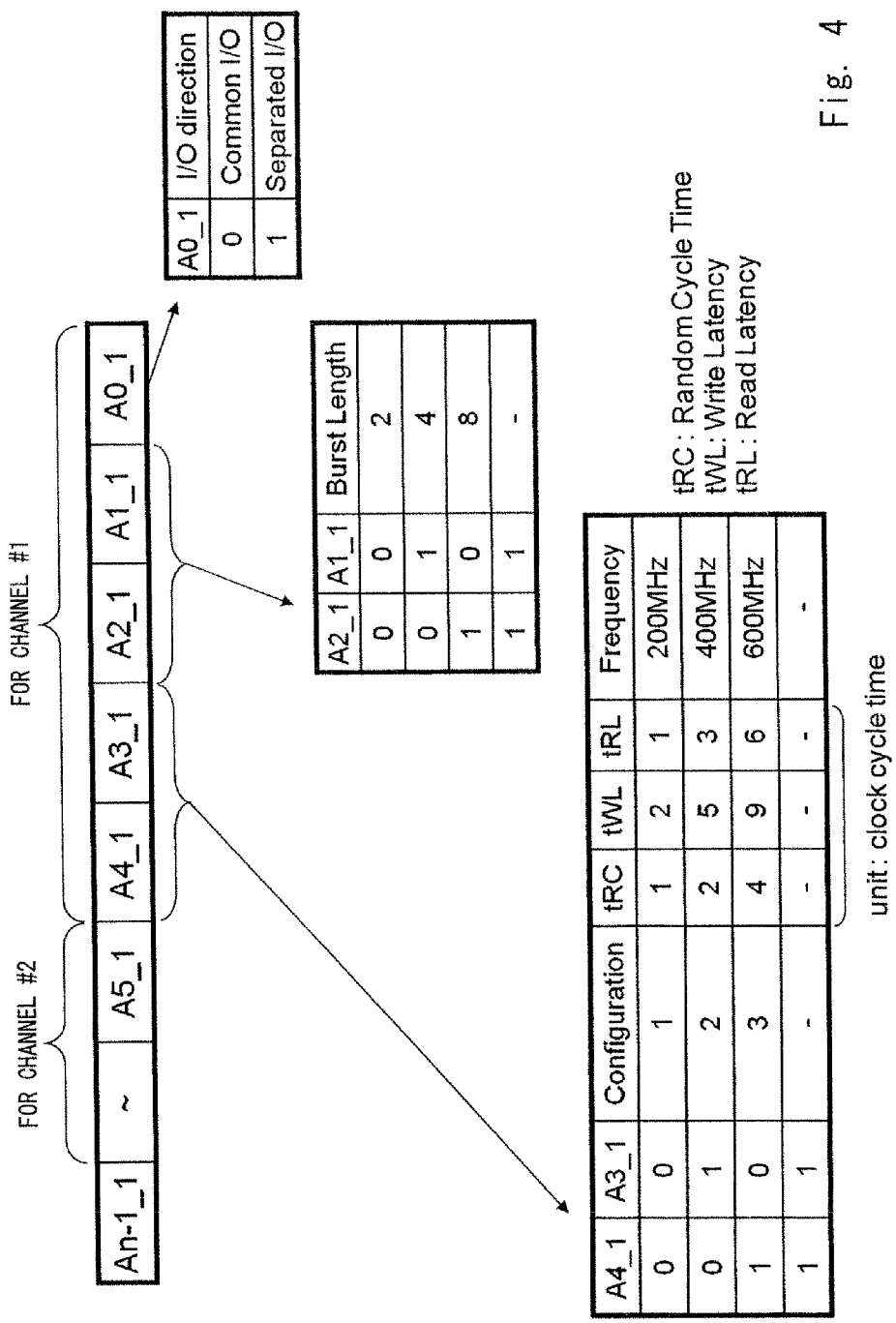
FIG. 4 is a diagram for explaining an address signal supplied to a memory according to a first embodiment of the present invention.

Next, an operating mode setting method for the memory 102 is explained in a more detailed manner with reference to FIGS. 3 and 4.

Note that the mode information, which are supplied to the respective mode information storage units 108-1 and 108-2 when the operating mode is set, are preferably supplied through an interface circuit(s) that is in an activated state all the time. In this way, it is possible to prevent such a problem that the mode information cannot be supplied to the mode information storage units 108-1 and 108-2. This embodiment is explained by using an example in which the mode information, which are supplied to the mode information storage units 108-1 and 108-2 when the operating mode is set, are supplied through the interface circuits 105-1 and 105-3 respectively, which are in an activated state all the time.

FIG. 3 shows relations between command signals and address signals supplied from an FPGA (101 or 102) to the memory 102. Note that only the command signals and address signals supplied from an FPGA (101 or 102) to the interface circuit 105-1 are explained below with reference to FIG. 3. However, the command signals and address signals supplied from an FPGA (101 or 102) to the interface circuit 105-3 are similar to those signals supplied to the interface circuit 105-1. Therefore, the explanation of the command signals and address signals supplied to the interface circuit 105-3 is omitted.

As shown in FIG. 3, the interface circuit 105-1 receives a chip select signal CSN_1, a write enable signal WEN_1, and a refresh signal REFN_1 from the FPGA as command signals. Further, the interface circuit 105-1 also receives an n-bit address signal A(n−1)_1 to A0_1 (n is a natural number) from the FPGA as an address signal.

For example, when the chip select signal CSN_1 has a logic value 1, the data writing operation or the like is not performed for the memory core connected to the interface circuit 105-1 (NOP in FIG. 3).

For example, when the chip select signal CSN_1, the write enable signal WEN_1, and the refresh signal REFN_1 have logic values 0, 1 and 1 respectively, data is read from a memory cell(s) specified by the address signal A(n−1)_1 to A0_1 (READ in FIG. 3).

For example, when the chip select signal CSN_1, the write enable signal WEN_1, and the refresh signal REFN_1 have logic values 0, 0 and 1 respectively, data is written into a memory cell(s) specified by the address signal A(n−1)_1 to A0_1 (WRITE in FIG. 3).

For example, when the chip select signal CSN_1, the write enable signal WEN_1, and the refresh signal REFN_1 have logic values 0, 1 and 0 respectively, a refresh operation is performed for the memory core connected to the interface circuit 105-1 (REFRESH in FIG. 3).

For example, when the chip select signal CSN_1, the write enable signal WEN_1, and the refresh signal REFN_1 have logic values 0, 0 and 0 respectively, i.e., when the operating mode is to be set, mode information included in the address signal A(n−1)_1 to A0_1 is stored in the mode information storage unit 108-1 (MRS in FIG. 3).

FIG. 4 is a diagram for explaining an address signal that is supplied from an FPGA (101 or 201) to the memory 102 when an operating mode is set. Note that only the address signal supplied from an FPGA (101 or 102) to the interface circuit 105-1 are explained below with reference to FIG. 4. However, the address signal supplied from an FPGA (101 or 102) to the interface circuit 105-3 is similar to the address signal supplied to the interface circuit 105-1. Therefore, the explanation of the address signal supplied to the interface circuit 105-3 is omitted.

As shown in FIG. 4, when the chip select signal CSN_1, the write enable signal WEN_1, and the refresh signal REFN_1 have logic values 0, 0 and 0 respectively (i.e., in the case of "MRS" in FIG. 3), i.e., when the operating mode is to be set, the mode information that is to be stored in the mode information storage unit 108-1 is included in the address signal A(n−1)_1 to A0_1.

Firstly, an operating mode setting method for the memory 102 in the case of the circuit configuration shown in FIG. 1 is explained with reference to FIG. 4. In the case of the circuit configuration shown in FIG. 1, address signals A4_1 to A0_1 are used as the mode information for a channel 1 (for the mode setting register 109-1) (i.e., as the first mode information) and address signals A9_1 to A5_1 are used as the mode information for a channel 2 (for the mode setting register 109-2) (i.e., as the second mode information).

The address signal A0_1 includes information that is used to determine whether a bidirectional input/output terminal, or an input terminal and an output terminal is (are) used as the external terminal through which data is exchanged among a plurality of external terminals provided in the interface circuit 105-1. For example, when the address signal A0_1 has a logic value 0, a bidirectional input/output terminal is used as the external terminal through which data is exchanged (Common I/O in FIG. 4). On the other hand, when the address signal A0_1 has a logic value 1, an input terminal and an output terminal are used as the external terminal through which data is exchanged (Separated I/O in FIG. 4).

The address signals A2_1 and A1_1 include information that is used to determine the burst length of data to be read from or written into the memory core 106-1. For example, when the address signals A2_1 and A1_1 have logic values 0 and 0 respectively, the burst length becomes "2". When the address signals A2_1 and A1_1 have logic values 0 and 1 respectively, the burst length becomes "4". When the address signals A2_1 and A1_1 have logic values 1 and 0 respectively, the burst length becomes "8".

The address signals A4_1 and A3_1 include information that is used to determine a random cycle time tRC, a write latency tWL, and a read latency tRL in the memory core 106-1. For example, when the address signals A4_1 and A3_1 have logic values 0 and 0 respectively, the random cycle time tRC, the write latency tWL, and the read latency tRL become one clock cycle, two clock cycles, and one clock cycle respectively. Further, the operating frequency the memory core 106-1 in this state becomes 200 MHz.

When the address signals A4_1 and A3_1 have logic values 0 and 1 respectively, the random cycle time tRC, the write latency tWL, and the read latency tRL become two clock cycles, five clock cycles, and three clock cycles respectively. Further, the operating frequency of the memory core 106-1 in this state becomes 400 MHz. When the address signals A4_1 and A3_1 have logic values 1 and 0 respectively, the random cycle time tRC, the write latency tWL, and the read latency tRL become four clock cycle, nine clock cycles, and six clock cycles respectively. Further, the operating frequency of the memory core 106-1 in this state becomes 600 MHz.

Similarly, the address signal A5_1 includes information that is used to determine whether a bidirectional input/output terminal, or an input terminal and an output terminal is (are) used as the external terminal through which data is exchanged among a plurality of external terminals provided in the interface circuit 105-2. The address signals A6_1 and A7_1 include information that is used to determine the burst length of data to be read from or written into the memory core 106-2. The address signals A8_1 and A9_1 include information that is used to determine a random cycle time tRC, a write latency tWL, and a read latency tRL in the memory core 106-2.

When an operating mode is to be set, information of the address signals A4_1 to A0_1 (mode information) is stored in the mode setting register 109-1. The access control unit 110-1 switches the operating mode of the memory core 106-1 based on the mode information stored in the mode setting register 109-1. As a result, the memory core 106-1 operates in the operating mode set by the access control unit 110-1 in the normal operation state. Therefore, the functional block 103-1 can access the memory core 106-1 in the access mode specified by the mode information stored in the mode setting register 109-1.

Further, when an operating mode is to be set, information of the address signals A9_1 to A5_1 (mode information) is stored in the mode setting register 109-2. The access control unit 110-2 switches the operating mode of the memory core 106-2 based on the mode information stored in the mode setting register 109-2. As a result, the memory core 106-2 operates in the operating mode set by the access control unit 110-2 in the normal operation state. Therefore, the functional block 103-2 can access the memory core 106-2 in the access mode specified by the mode information stored in the mode setting register 109-2.

Similarly, when an operating mode is to be set, information of the address signals (mode information) supplied to the interface circuit 105-3 are stored in the mode setting registers 109-3 and 109-4. The access control unit 110-3 and 110-4 switch the operating modes of the memory cores 106-3 and 106-4 respectively based on the mode information stored in the mode setting registers 109-3 and 109-4 respectively. As a result, the memory cores 106-3 and 106-4 operate in the operating modes set by the access control units 110-3 and 110-4 respectively in the normal operation state. Therefore, the functional blocks 103-3 and 103-4 can access the memory cores 106-3 and 106-4 respectively in the access modes specified by the mode information stored in the mode setting registers 109-3 and 109-4 respectively.

Next, an operating mode setting operation for the memory 102 in the case of the circuit configuration shown in FIG. 2 is explained with reference to FIG. 4. In the case of the circuit configuration shown in FIG. 2, address signals A4_1 to A0_1 are used as the mode information for a channel 1 (for the mode setting registers 109-1 and 109-2). That is, the same mode information is stored in both of the mode setting registers 109-1 and 109-2. Note that, as an alternative configuration, the address signals A4_1 to A0_1 may be used as the mode information for the mode setting register 109-1 and the address signals A9_1 to A5_1 may be used as the mode information for the mode setting register 109-2. In this case, the mode information for the mode setting register 109-1 and the mode information for the mode setting register 109-2 have the same content as each other. A specific operating mode setting method in the circuit configuration shown in FIG. 2 may be the same as the above-described operating mode setting method in the circuit configuration shown in FIG. 1, and therefore its explanation is omitted.

In this case, in the normal operation state, the functional block 203-1 can access the memory core 106-1 in the access mode specified by the mode information stored in the mode setting register 109-1. Further, the functional block 203-1 can access the memory core 106-2 in the access mode specified by the mode information stored in the mode setting register 109-2.

Similarly, in the normal operation state, the functional block 203-2 can access the memory core 106-3 in the access mode specified by the mode information stored in the mode setting register 109-3. Further, the functional block 203-2 can access the memory core 106-4 in the access mode specified by the mode information stored in the mode setting register 109-4.

Note that the above-described operating mode setting conditions for the memory 102 are merely an example, and other various setting conditions can be also used within the limit of the capability of each memory core. Further, the bit width of the address signal that is used to transmit the mode information is not limited to five-bit width per channel. That is, the bit width of the address signal can be changed as appropriate. By transmitting mode information by using the address signal line and the command signal line as described above, the need for an additional signal line(s) and an external terminal(s) for transmitting the mode information is eliminated, thereby making it possible to prevent the increase in the circuit scale (circuit size).

(Timing Chart)

Figure 5A:
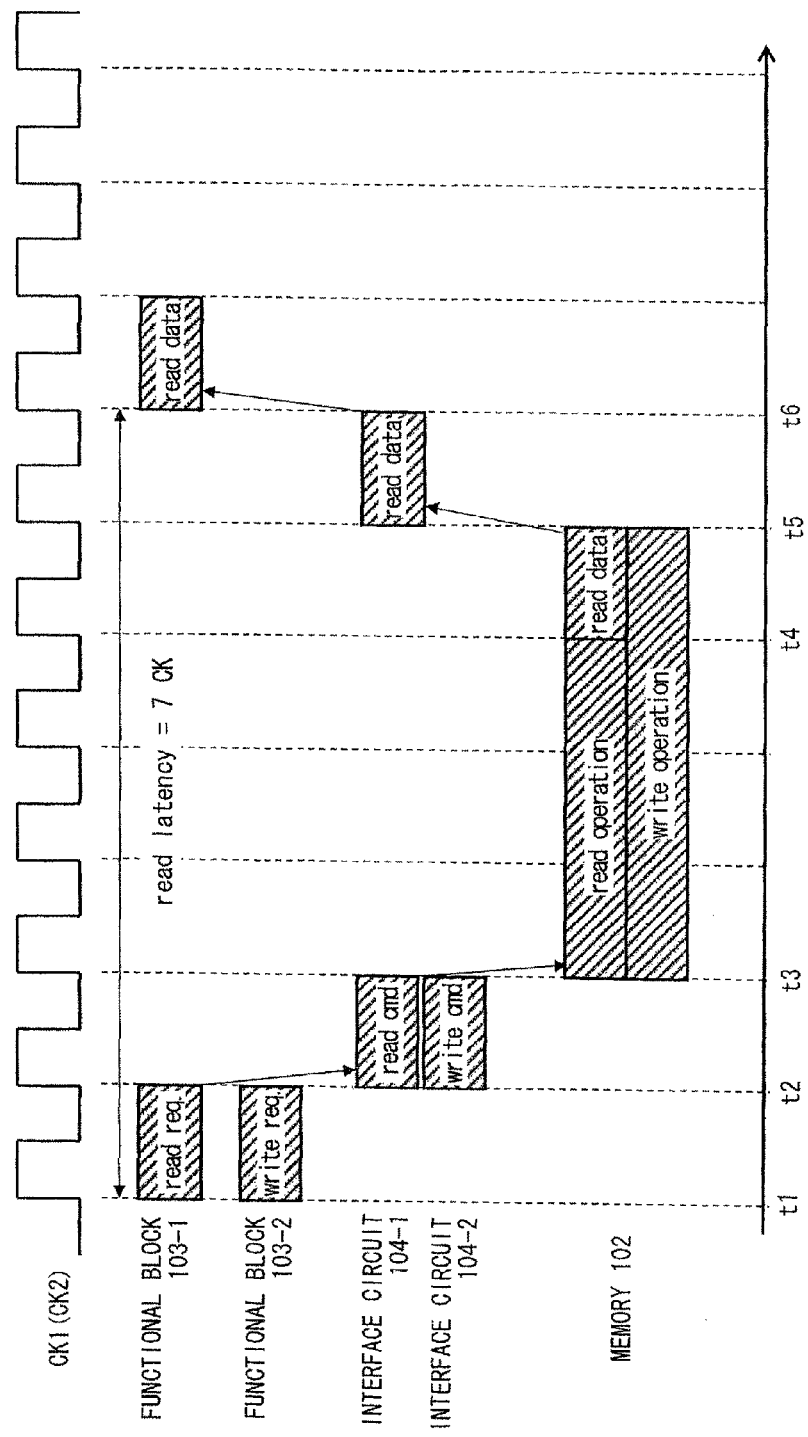
FIG. 5A is a timing chart showing an operation of a semiconductor integrated circuit according to a first embodiment of the present invention.

FIG. 5A is a timing chart showing an example of an operation of the semiconductor integrated circuit shown in FIG. 1. More specifically, FIG. 5A is a timing chart in a case where the functional block 103-1 requests data reading from the memory 102 and the functional block 103-2 requests data writing to the memory 102 at the same time. That is, FIG. 5A is a timing chart in a case where access requests occur under the same conditions as those shown in the timing chart shown in FIG. 11B.

It is assumed that the amount of read data that each of the functional blocks 103-1 to 103-3 needs to receive from the memory 102 by one data read request is a data amount X. Meanwhile, it is assumed that the amount of read data that the functional block 103-4 needs to receive from the memory 102 by one data read request is twice the data mount X (i.e., data amount 2X). That is, the functional block 103-4 needs to receive read data that is twice as large as the read data of the functional block 103-1 by one data read request. Further, the memory 102 can transmit read data having the data amount X in response to one data read request.

Firstly, the functional block 103-1 issues a read request to the interface circuit 104-1 and the functional block 103-2 issues a write request to the interface circuit 104-2 at the same time (time t1). That is, the read request and the write request issued from the functional blocks 103-1 and 103-2 are directly transmitted to the interface circuits 104-1 and 104-2 without being arbitrated by any arbitration circuit.

The interface circuit 104-1 generates a command signal and an address signal according to the read request received from the functional block 103-1 and outputs the generated signals to the memory 102. At the same time, the interface circuit 104-2 generates a command signal, an address signal, a write data signal according to the write request received from the functional block 103-2 and outputs the generated signals to the memory 102 (time t2).

In the memory 102, the interface circuit 105-1 receives the command signal and the address signal output from the FPGA 101 and transfers the received signals to the memory core 106-1 located behind the interface circuit 105-1 (time t3). At the same time, the interface circuit 105-2 receives the command signal, the address signal, and the write data signal output from the FPGA 101 and transfers the received signals to the memory core 106-2 located behind the interface circuit 105-2 (time t3). In this manner, the activated interface circuits 105-1 and 105-2 are connected to different memory cores in the memory 102 according to this embodiment. As a result, even when read/write requests are simultaneously issued from two or more functional blocks, these requests are processed in parallel without being arbitrated by any arbitration circuit.

In the memory core 106-1, after the reading operation that takes a predetermined period (time t3 to t4), data stored in the memory cell(s) specified by the address signal is read out (time t4). The interface circuit 105-1 outputs the data read from the memory core 106-1 to the FPGA 101 (time t4). Meanwhile, the access to the memory core 106-2 is performed in parallel with the access to the memory core 106-1, and after the writing operation that takes a predetermined period, the data is written into the memory cell(s) specified by the address signal (time t3 to t5).

In the FPGA 101, the interface circuit 104-1 receives the data output from the memory 102 and transfers the received data to the functional block 103-1, which has issued the read request (time t5). The functional block 103-1 takes in the data transferred from the interface circuit 104-1 in synchronization with the clock signal CK1 (time t6). In this manner, a series of operations for the data read request and the data write request has been completed.

In the example shown in FIG. 5A, the time period from when the functional block 103-1 issues the data read request to when the functional block 103-1 receives the data is seven clock cycles (time t1 to t6), which is shorter than the time period of the example under the same condition shown in FIG. 11B by six clock cycles. That is, the data processing performance is improved by an amount equivalent to the decrease in the number of required clock cycles.

Further, regarding the data processing performance, the time required for the processing performed by the arbitration circuit is eliminated. Therefore, even compared to the case where only the data read request is issued as shown in FIG. 11A, the processing time is reduced by two clock cycles.

As described above, in the memory (semiconductor device) according to this embodiment of the present invention, the select circuit selects a signal path(s) between activated interface circuits and memory cores in such a manner that the interface circuits are connected to different memory cores. In other words, in the memory (semiconductor device) according to this embodiment, the select circuit selects a signal path(s) in such a manner that each of a plurality of memory cores is connected to one of a plurality of interface circuits. As a result, in the memory according to this embodiment, the situation in which two or more functional blocks simultaneously issue read/write requests to the same memory core never occurs. Therefore, there is no need to perform arbitration by using an arbitration circuit, and thus making it possible to prevent the deterioration of the data processing performance.

Further, even when read/write requests are simultaneously issued from two or more functional blocks, these read/write requests are issued to different memory cores. Therefore, even when the number of functional blocks is changed as in the case of FIG. 2, each of these functional blocks can maintain certain performance all the time.

Figure 5B:
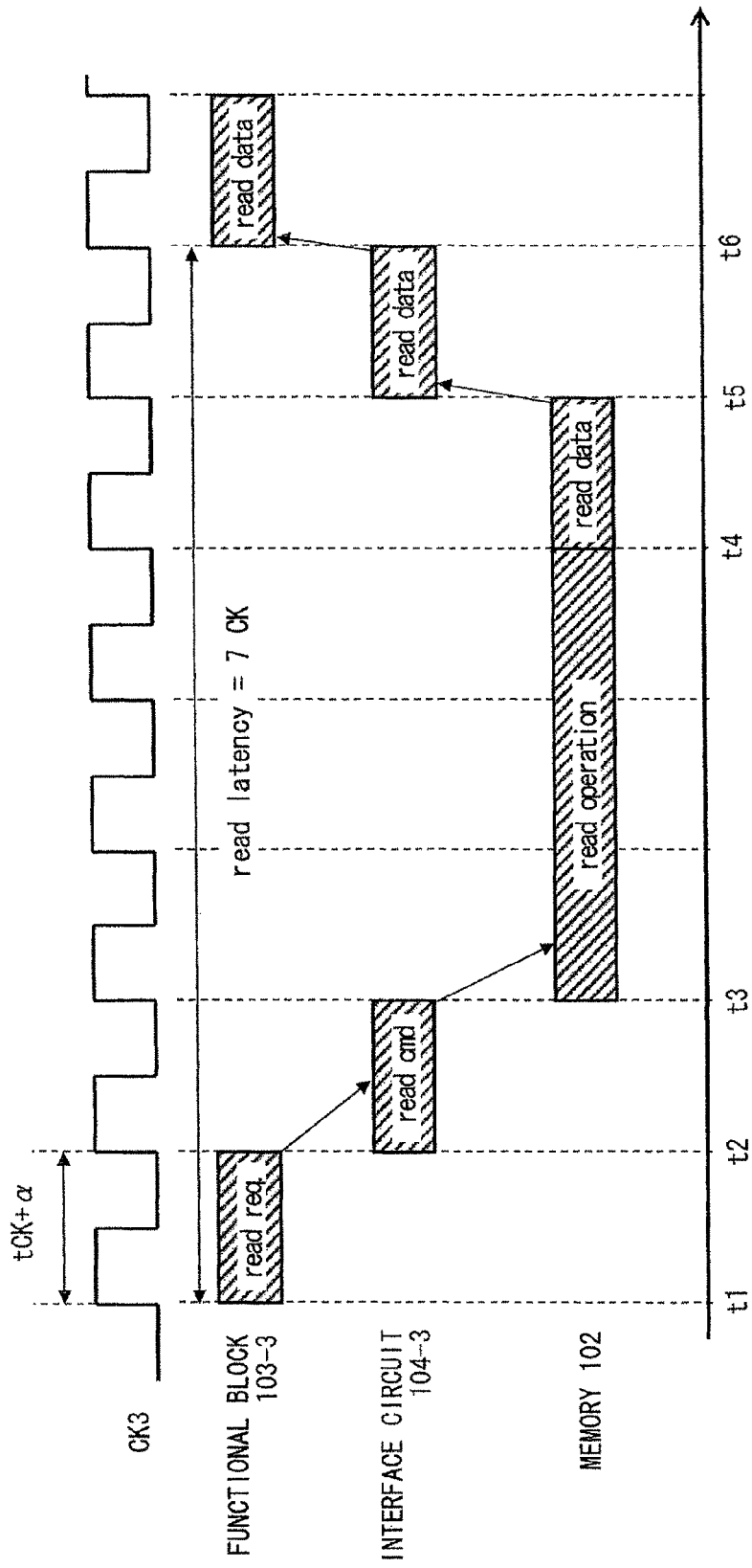
FIG. 5B is a timing chart showing an operation of semiconductor integrated circuit according to a first embodiment of the present invention.

FIG. 5B is a timing chart showing another example of an operation of the semiconductor integrated circuit shown in FIG. 1. More specifically, FIG. 5B is a timing chart in a case where the functional block 103-3 solely requests data reading from the memory 102. That is, similarly to the timing chart shown in FIG. 11A, FIG. 5B is a timing chart in a case where one functional block solely issues a data read request for data having a data amount X.

Note that the functional block 103-3 can operate in a lower operating frequency than that of the other functional blocks 103-1, 103-2 and 103-4. Note that as described previously, the memory 102 can set an independent operating mode for each of the independently-accessible memory cores 106-1 to 106-4. That is, the memory 102 can set operating modes in such a manner that the memory core 106-3 operates by using a clock signal CK3 having a frequency lower than that of the other clock signals CK1, CK2 and CK4. In this manner, the functional block 106-3 can operate in a desired operating frequency that is lower than the operating frequency of the other functional blocks.

Firstly, the functional block 103-3 issues a read request the interface circuit 104-3 (time t1). That is, the read request issued from the functional block 103-3 is directly transmitted to the interface circuit 104-3 without being arbitrated by any arbitration circuit. The interface circuit 104-3 generates a command signal and an address signal according to the read request received from the functional block 103-3 and outputs the generated signals to the memory 102 (time t2).

In the memory 102, the interface circuit 105-3 receives the command signal and the address signal output from the FPGA 101 and transfers the received signals to the memory core 106-3 located behind the interface circuit 105-3 (time t3). In the memory core 106-3, after the reading operation that takes a predetermined period (time t3 to t4), data stored in the memory cell(s) specified by the address signal is read out (time t4). The interface circuit 105-3 outputs the data read from the memory core 106-1 to the FPGA 101 (time t4).

In the FPGA 101, the interface circuit 104-3 receives the data output from the memory 102 and transfers the received data to the functional block 103-3, which has issued the read request (time t5). The functional block 103-3 takes in the data transferred from the interface circuit 104-3 in synchronization with the clock signal CK3 (time t6). In this manner, a series of operations for the data read request has been completed.

As described above, it is possible to set an independent operating mode for each of a plurality of independently-accessible memory cores in the memory according to this embodiment of the present invention. In other words, it is possible to store independent mode information in each of a plurality of mode setting registers in the memory according to this embodiment. As a result, each of a plurality of functional blocks can perform a memory access operation in a desired operating frequency. That is, unlike the case shown in FIG. 11A, each of the plurality of functional blocks does not need to perform a memory access operation in an unnecessarily high frequency or an unnecessarily low frequency. As a result, the memory according to this embodiment of the present invention can further prevent the deterioration of the data processing performance.

Further, the memory according to this embodiment can change the operating modes of the memory cores as appropriate according to the access mode of the functional block that has issued the accesses request. In other words, the memory according to this embodiment can change the mode information stored in a plurality of mode setting registers as appropriate. Therefore, even when the functional blocks are changed by reprogramming the FPGA 101, each of the functional blocks can access the memory in a desired operating frequency. That is, the memory according to this embodiment can cope with the situation in a flexible manner.

Note that, regarding the data processing performance in the example shown in FIG. 5B, the time required for the processing performed by the arbitration circuit is eliminated. Therefore, even compared to the case shown in FIG. 11A, the processing time is reduced by two clock cycles.

Figure 5C:
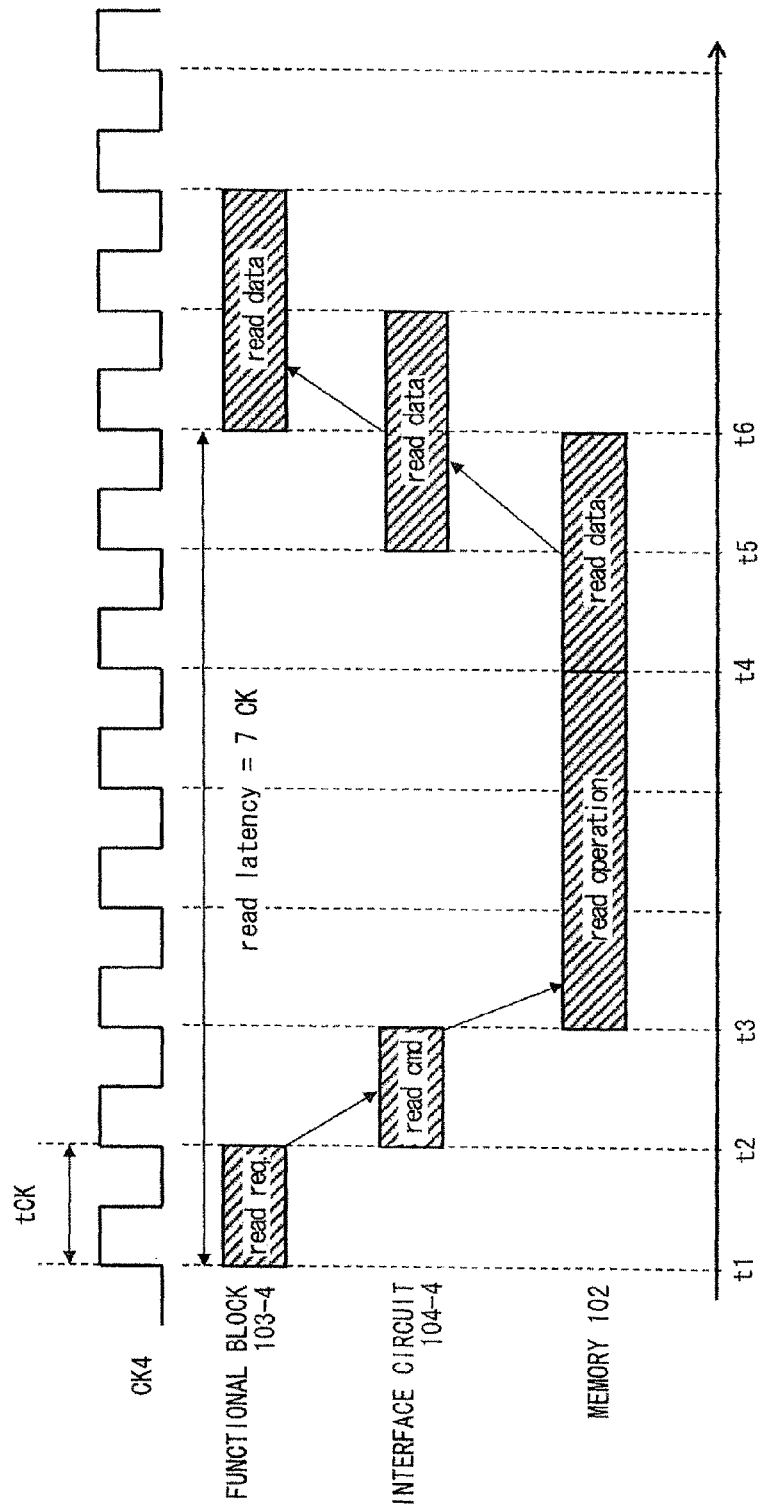
FIG. 5C is a timing chart showing an operation of semiconductor integrated circuit according to a first embodiment of the present invention.

FIG. 5C is a timing chart showing another example of an operation of the semiconductor integrated circuit shown in FIG. 1. More specifically, FIG. 5C is a timing chart in a case where the functional block 103-4 solely requests data reading from the memory 102. That is, similarly to the timing chart shown in FIG. 11C, FIG. 5C is a timing chart in a case where one functional block solely issues a data read request for data having a data amount 2X.

Note that as described previously, the memory 102 can set an independent operating mode for each of the independently-accessible memory cores 106-1 to 106-4. Therefore, the memory 102 can set the operating modes in such a manner that data having a data amount 2X is read out from the memory core 106-4 in response to one data read request. That is, the memory 102 can set the operating modes in such a manner that the burst length of the data read out from the memory core 106-4 becomes twice as large as the burst length of the other memory cores. As a result, the functional block 103-4 can receive read data having a desired data amount (2X) in response to one data read request without dividing the read request into multiple sections by using an arbitration circuit.

Firstly, the functional block 103-4 issues a read request to the interface circuit 104-4 (time t1). That is, the read request issued from the functional block 103-4 is directly transmitted to the interface circuit 104-4 without being arbitrated by any arbitration circuit. The interface circuit 104-4 generates a command signal and an address signal according to the read request received from the functional block 103-4 and outputs the generated signals to the memory 102 (time t2).

In the memory 102, the interface circuit 105-4 receives the command signal and the address signal output from the FPGA 101 and transfers the received signals to the memory core 106-4 located behind the interface circuit 105-4 (time t3). In the memory core 106-4, after the reading operation that takes a predetermined period (time t3 to t4), data stored in the memory cell(s) specified by the address signal is read out (time 4). In this process, data having a data amount (2X) that is twice as large as the data amount in the case shown in FIG. 5B is read out (time t4 to t6). The interface circuit 105-4 outputs the data read from the memory core 106-4 to the FPGA 101 (time t4).

In the FPGA 101, the interface circuit 104-4 receives the data output from the memory 102 and transfers the received data to the functional block 103-4, which has issued the read request (time t5). The functional block 103-4 takes in the data transferred from the interface circuit 104-4 in synchronization with the clock signal CK4 (time t6). In this manner, a series of operations for the data read request has been completed.

In the example shown in FIG. 5C, the time period from when the functional block 103-4 issues the data read request to when the functional block 103-4 receives the data is seven clock cycles (time t1 to t6), which is shorter than the time period of the case shown in FIG. 11C by six clock cycles. That is, the data processing performance is improved by an amount equivalent to the decrease in the number of required clock cycles.

As described above, it is possible to set an independent operating mode for each of a plurality of independently-accessible memory cores in the memory according to this embodiment of the present invention. In other words, it is possible to store independent mode information in each of a plurality of mode setting registers in the memory according to this embodiment. Therefore, in contrast to the case shown in FIG. 11C, each of the plurality of functional blocks can receive read data having a desired burst length without dividing the read request into multiple sections by using an arbitration circuit. As a result, the memory according to this embodiment of the present invention can further prevent the deterioration of the data processing performance.

Further, the memory according to this embodiment can change the operating modes of the memory cores as appropriate according to the access mode of the functional block that has issued the accesses request. In other words, the memory according to this embodiment can change the mode information stored in a plurality of mode setting registers as appropriate. Therefore, even when the functional blocks are changed by reprogramming the FPGA 101, each of the functional blocks can receive read data having a desired burst length. That is, the memory according to this embodiment can cope with the situation in a flexible manner.

Second Embodiment

Figure 6:
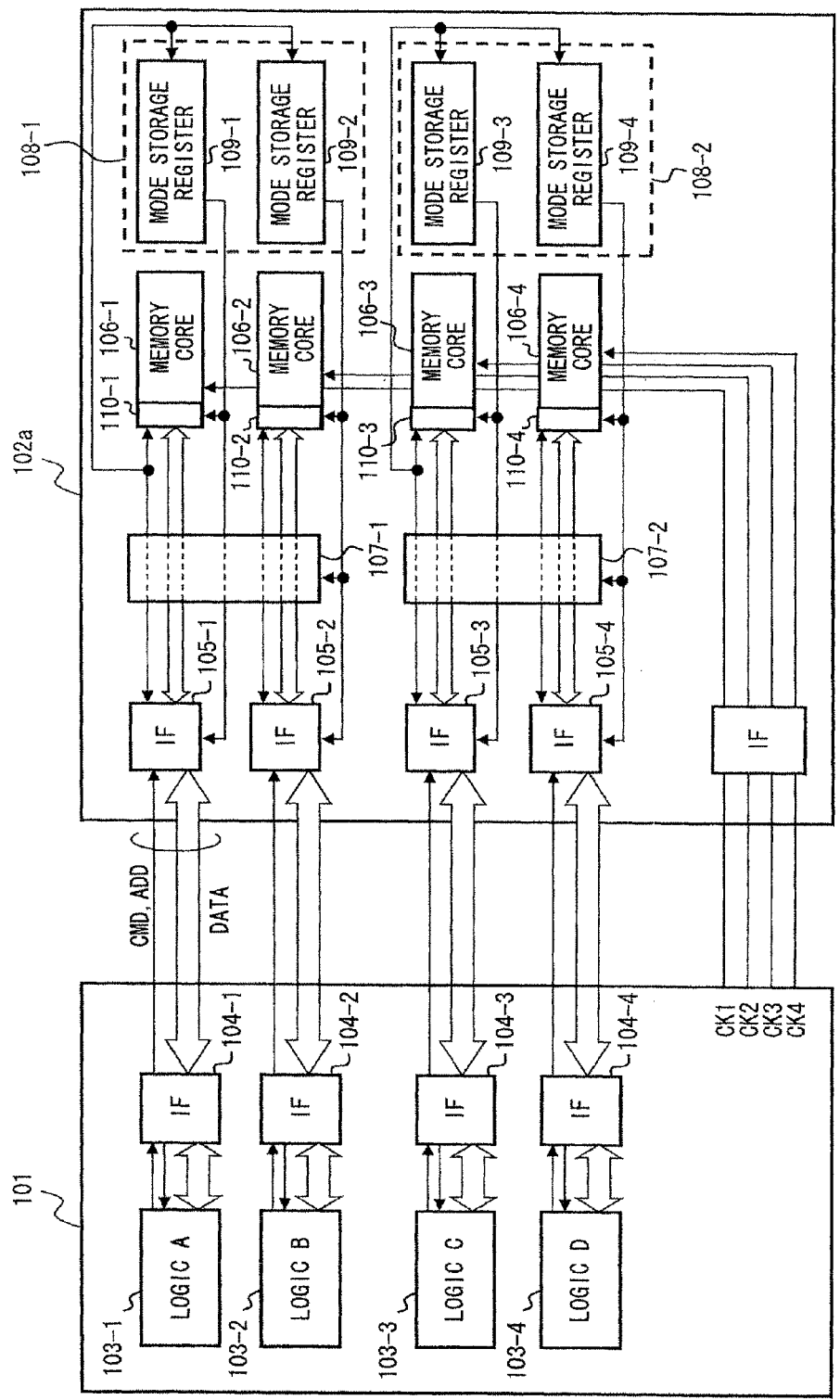
FIG. 6 is a block diagram showing a semiconductor integrated circuit according to a second embodiment or the present invention.

FIG. 6 is a block diagram showing a semiconductor integrated circuit including a memory (semiconductor apparatus)

according to a second embodiment of the present invention. In contrast to the memory 102 shown in FIG. 1, the switching signal S1 is not supplied from the FPGA 101 in the memory 102a shown in FIG. 6 Note that in the memory 102a shown in FIG. 6, signal paths are selected by the select circuits 107-1 and 107-2 based on mode information that is included in the address signal when the operating mode is set. Further, the activation/deactivation of the interface circuits 105-1 to 105-4 is also controlled base on the mode information included in the address signal. The other configuration of the semiconductor integrated circuit shown in FIG. 6 is similar to that of the semiconductor integrated circuit shown in FIG. 1, and therefore its explanation is omitted.

Figure 7:
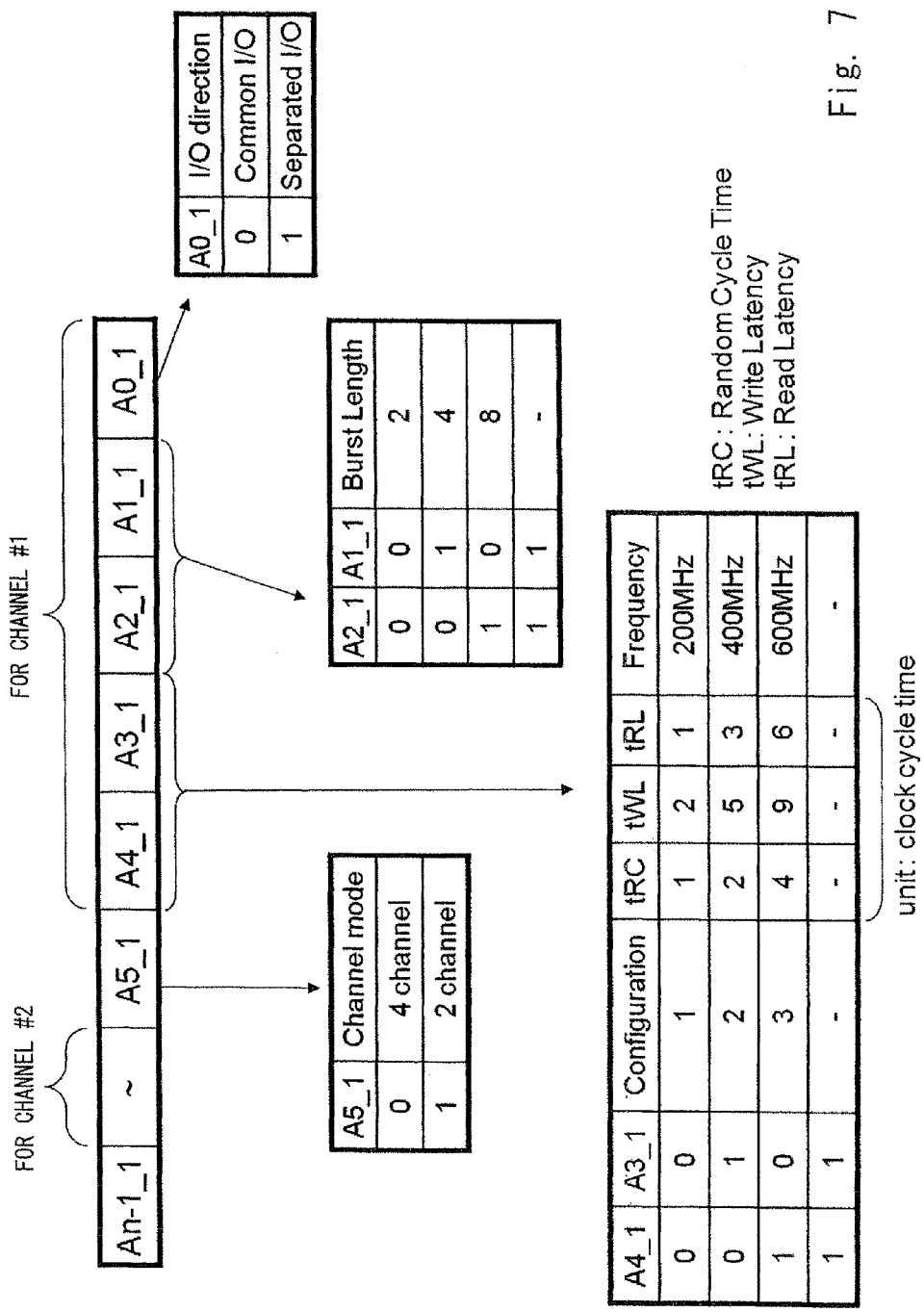
FIG. 7 is a diagram for explaining an address signal supplied to a memory according to a second embodiment of the present invention.

FIG. 7 is a diagram for explaining an address signal that is supplied from the FPGA 101 to the memory 102a when an operating mode is set. Note that only the address signal supplied from the FPGA 101 to the interface circuit 105-1 are explained below with reference to FIG. 7. However, the address signal supplied from the FPGA 101 to the interface circuit 105-3 is similar to the address signal supplied to the interface circuit 105-1. Therefore, the explanation of the address signal supplied to the interface circuit 105-3 is omitted.

As shown in FIG. 7, when an operating mode is to be set, the mode information that is to be stored in the mode information storage unit 108-1 is included in the address signal A (n−1)_1 to A0_1. Note that address signals A4_1 to A0_1 are used as the mode information for a channel 1. Address signals A10_1 to A6_1 are used as the mode information for a channel 2.

Further, an address signal A5_1 includes information (switching information) that is used by the select circuit 107-1 to select signal paths and also used to determine the activation/deactivation of the interface circuits 105-1 and 105-2. For example, when the address signal A5_1 has a logic value 0, signal paths are selected in such a manner that the interface circuit 105-1 is connected to the memory core 106-1 and the interface circuit 105-2 is connected to the memory core 106-2. On the other hand, when the address signal A5_1 has a logic value 1, signal paths are selected in such a manner that the interface circuit 105-1 is connected to the two memory cores, i.e., the memory cores 106-1 and 106-2.

As described above, the memory according to this embodiment of the present invention can achieve similar advantageous effects to those of the first embodiment by incorporating information corresponding to the switching signal S1 into the mode information. Further, the need for the external terminal for the switching signal S1 is eliminated, and thereby making it possible to prevent the increase in the circuit scale (circuit size).

Third Embodiment

Figure 8:
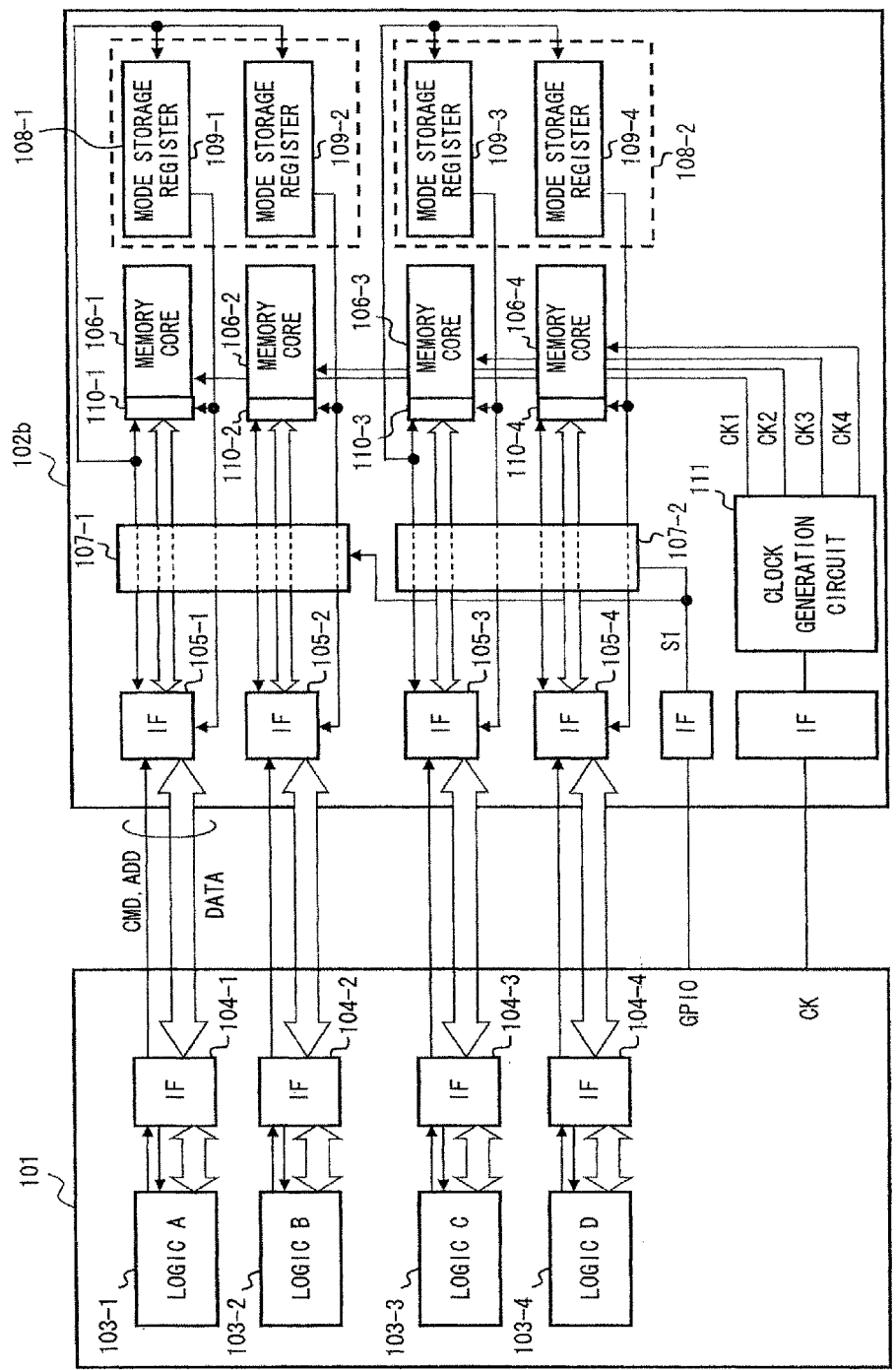
FIG. 8 is a block diagram showing a semiconductor integrated circuit according to a third embodiment of the present invention.

FIG. 8 is a block diagram showing a semiconductor integrated circuit including a memory (semiconductor apparatus) according to a third embodiment of the present invention. In comparison to the memory 102 shown in FIG. 1, a memory 102b shown in FIG. 8 further includes a clock generation circuit 111. The clock generation circuit 111 generates clock signals CK1 to CK4 each having an individual frequency based on a clock signal CK supplied from the FPGA 101. For example, the clock generation circuit 111 generates clock signals CK1 to CK4 each having a desired frequency based on mode information stored in the mode setting registers 109-1 to 109-4.

As described above, the memory according to this embodiment of the present invention is equipped with clock generation circuit 111 and thus can generate clock signals having desired frequencies. Therefore, it is possible to define the conditions for an operating mode for each memory core in a more flexible manner.

As described above, in the memory (semiconductor apparatus) according to the above-described first to third embodiments, the select circuit(s) selects signal paths between the activated interface circuits and the memory array (s) in such a manner that the interface circuits are connected to different memory cores. In other words, in the memory (semiconductor apparatus) according to the above-described embodiments, the select circuit(s) selects signal paths in such a manner that each of the plurality of memory cores is connected to one of the plurality of interface circuits. As a result, in the memory according to the above-described embodiments, the situation in which two or more functional blocks simultaneously issue read/write requests to the same memory core never occurs. Therefore, there is no need to perform arbitration by using an arbitration circuit, and thus making it possible to prevent the deterioration of the data processing performance.

Further, it is possible to set an independent operating mode for each of a plurality of independently-accessible memory cores in the memory according to the above-described first to third embodiments. In other words, it is possible to store independent mode information in each of a plurality of mode setting registers in the memory according to the above-described first to third embodiments. Therefore, each of a plurality of functional blocks can perform a memory access operation in a desired access mode. As a result, the memory according to this embodiment of the present invention can further prevent the deterioration of the data processing performance.

Further, the memory according to the above-described first to third embodiments can change the operating modes of the memory cores as appropriate according to the access mode of the functional block that has issued the accesses request. In other words, the memory according to the above-described first to third embodiments can change the mode information stored in a plurality of mode setting registers as appropriate. Therefore, even when the functional blocks are changed by reprogramming the FPGA, each of the functional blocks can access the memory in a desired access mode. That is, it is possible to cope with the situation in a flexible manner.

Note that the present invention is not limited to the above-described first to third embodiments and various modifications can be made without departing from the spirit and scope of the present invention. Although examples in which the memory includes four interface circuits and four memory cores are explained in the above-described first to third embodiments, the present invention is not limited these configurations. That is, the above-described embodiments can be modified as appropriate so that they can be applied to other circuit configurations including an arbitrary number of interface circuits and an arbitrary number of memory cores.

Figure 9:
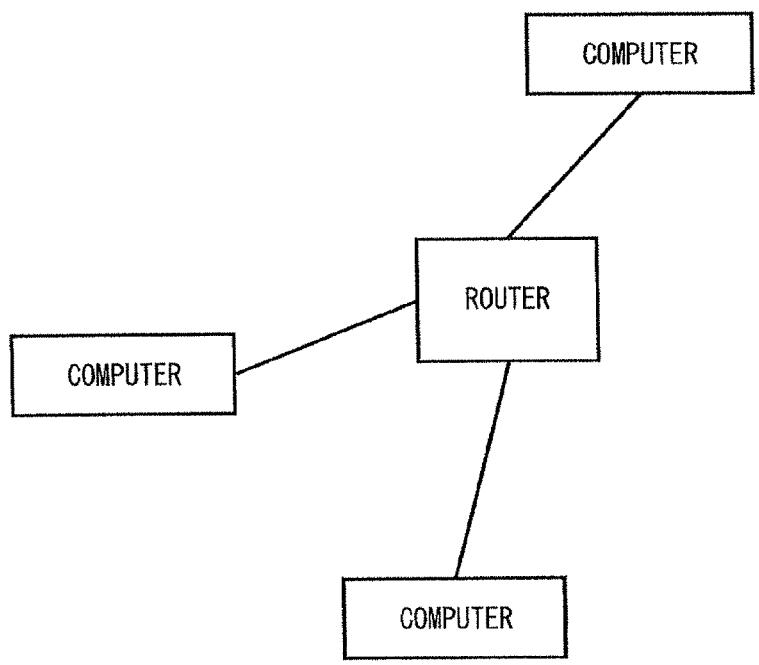
FIG. 9 shows a network apparatus equipped with a memory according to an aspect of the present invention.

A memory according to an aspect of the present invention may be installed in a router that requires a high-speed data processing capability. It is expected that the power consumption of the router is reduced as the data processing performance of the router improves. Note that the term "router" means a network apparatus that connects different networks with each other as shown in FIG. 9.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
   first and second bus-interface circuits;
   a mode information storage unit that stores first and second mode information, the first and second mode information being able to be set through the first bus-interface circuit;
   a first memory core that operates based on the first mode information, the first memory core being connected to the first bus-interface circuit and supplied with a first clock signal;
   a second memory core, the second memory core being supplied with a second clock signal;
   a select circuit that selectively connects the second memory core to the first or second bus-interface circuit based on predetermined switching information; and
   a clock generation circuit that generates the first and second clock signals based on at least part of the first and second mode information, wherein
   the second memory core operates based on the second mode information when the second memory core is connected to the second bus-interface circuit.

2. The semiconductor apparatus according to claim 1, wherein the second memory core operates based on the first mode information when the second memory core is connected to the first bus-interface circuit.

3. The semiconductor apparatus according to claim 1, wherein the select circuit uses at least part of first and second mode information stored in the mode information storage unit as the predetermined switching information.

4. The semiconductor apparatus according to claim 1, wherein the select circuit uses an externally-input signal as the predetermined switching information.

5. The semiconductor apparatus according to claim 1, wherein
   the semiconductor apparatus performs access to the first memory core with a burst length, the burst length being determined based on the first mode information, and
   the semiconductor apparatus performs access to the second memory core with another burst length, the another burst length being determined based on the second mode information.

6. The semiconductor apparatus according to claim 1, wherein
   the semiconductor apparatus operates the first memory core in an operating frequency, the operating frequency being determined based on the first mode information, and
   the semiconductor apparatus operates the second memory core in another operating frequency, the another operating frequency being determined based on the second mode information.

7. A network apparatus comprising a semiconductor apparatus according to claim 1.

8. The semiconductor apparatus according to claim 2, wherein when the second memory core is connected to the first bus-interface circuit, an input terminal of the second bus-interface circuit is fixed at a predetermined logic level.

9. The semiconductor apparatus according to claim 2, wherein when the second memory core is connected to the first bus-interface circuit, the second memory core operates based on the second mode information having a same content as that of the first mode information.

10. The semiconductor apparatus according to claim 5, wherein
    data is read out from the first memory core with a read latency specified by the first mode information, and
    data is read out from the second memory core with another read latency specified by the second mode information.

11. The semiconductor apparatus according to claim 10, wherein
    data is written into the first memory core with a write latency specified by the first mode information, and
    data is written into the second memory core with another write latency specified by the second mode information.

12. The semiconductor apparatus according to claim 11, wherein
    access to the first memory core is permitted after a time interval specified by the first mode information, and
    access to the second memory core is permitted after another time interval specified by the second mode information.

13. A semiconductor apparatus comprising:
    a plurality of memory cores;
    a plurality of bus-interface circuits, each capable of interfacing access from an external circuit to at least one of the plurality of memory cores;
    a select circuit that selects a signal path in such a manner that each of the plurality of memory cores is connected to one of the plurality of bus-interface circuits; and
    a control unit that switches respective operating modes of the plurality of memory cores according to respective access modes from the external circuit to the plurality of memory cores, wherein
    the plurality of bus-interface circuits include first and second bus-interface circuits,
    a mode information storage unit stores first and second mode information, the first and second mode information being able to be set through the first bus-interface circuit,
    the plurality of memory cores include:
       a first memory core that operates based on the first mode information, the first memory core being connected to the first bus-interface circuit and supplied with a first clock signal;
       a second memory core, the second memory core being supplied with a second clock signal, and
    a clock generation circuit generates the first and second clock signals based on at least part of the first and second mode information.

14. The semiconductor apparatus according to claim 13, wherein the external circuit is a field programmable gate array whose circuit configuration is rewritable.

15. The semiconductor apparatus according to claim 13, wherein
    the mode information storage unit stores a plurality of mode information, including the first and second mode information, specifying respective access modes from the external circuit to the plurality of memory cores including the first and second memory cores, wherein
    the control unit switches respective operating modes of the plurality of memory cores based on the plurality of mode information.

16. The semiconductor apparatus according to claim 15, wherein when at least two memory cores among the plurality of memory cores are connected to a same bus-interface circuit, same mode information is stored in the mode information storage unit for the at least two memory cores.

17. The semiconductor apparatus according to claim 15, wherein the plurality of mode information are supplied from the external circuit to the mode information storage unit through a predetermined bus-interface circuit among the plurality of bus-interface circuits.

18. The semiconductor apparatus according to claim 17, wherein
the mode information storage unit further stores switching information supplied through the predetermined bus-interface circuit together with the plurality of mode information, and
the select circuit selects the signal path based on the switching information stored in the mode information storage unit.

* * * * *